US010297296B2

(12) United States Patent
Ishizu et al.

(10) Patent No.: US 10,297,296 B2
(45) Date of Patent: May 21, 2019

(54) STORAGE DEVICE, METHOD FOR OPERATING STORAGE DEVICE, SEMICONDUCTOR DEVICE, ELECTRONIC COMPONENT, AND ELECTRONIC DEVICE

(71) Applicant: Semiconductor Energy Laboratory Co., Ltd., Atsugi-shi, Kanagawa-ken (JP)

(72) Inventors: Takahiko Ishizu, Atsugi (JP); Kiyoshi Kato, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/695,210

(22) Filed: Sep. 5, 2017

(65) Prior Publication Data

US 2018/0075886 A1    Mar. 15, 2018

(30) Foreign Application Priority Data

Sep. 9, 2016    (JP) .................................. 2016-176930

(51) Int. Cl.
*G11C 14/00*    (2006.01)
*G11C 7/12*    (2006.01)
(Continued)

(52) U.S. Cl.
CPC ................ *G11C 7/12* (2013.01); *G11C 5/148* (2013.01); *G11C 8/08* (2013.01); *G11C 11/4074* (2013.01);
(Continued)

(58) Field of Classification Search
CPC .................................................. G11C 14/0054
See application file for complete search history.

(56) References Cited

U.S. PATENT DOCUMENTS 8,314,637 B2    11/2012    Kato et al.
8,362,538 B2    1/2013    Koyama et al.
(Continued)

FOREIGN PATENT DOCUMENTS

JP    2014-160526 A    9/2014
JP    2014-200083 A    10/2014
JP    2015-207760 A    11/2015

OTHER PUBLICATIONS

Ishizu.T et al., "SRAM with C-Axis Aligned Crystalline Oxide Semiconductor: Power Leakage Reduction Technique for Microprocessor Caches", IMW 2014 (6th IEEE International Memory Workshop), May 18, 2014, pp. 103-106.

*Primary Examiner* — Huan Hoang
*Assistant Examiner* — Jay W. Radke
(74) *Attorney, Agent, or Firm* — Robinson Intellectual Property Law Office; Eric J. Robinson

(57) ABSTRACT

A storage device capable of performing power gating is provided. A memory cell of the storage device includes a bistable circuit, a first transistor, a second transistor, and a backup circuit. The first transistor and the second transistor are electrically connected to a first bit line and a second bit line, respectively. A precharge circuit that precharges the first bit line and the second bit line with different voltages is provided. The backup circuit includes a retention node, an input node, an output node, a third transistor, a fourth transistor, and a capacitor. The third transistor controls electrical continuity between the retention node and the input node. A gate of the fourth transistor and a terminal of the capacitor are electrically connected to the retention node. The input node is electrically connected to one of nodes Q and Qb of the bistable circuit, and the output node is electrically connected to the other of the nodes Q and Qb of the bistable circuit.

13 Claims, 14 Drawing Sheets

(51) Int. Cl.
    *G11C 8/08*      (2006.01)
    *G11C 11/4074*      (2006.01)
    *G11C 11/4091*      (2006.01)
    *G11C 11/56*      (2006.01)
    *G11C 5/14*      (2006.01)
    *G11C 11/412*      (2006.01)
    *G11C 11/419*      (2006.01)

(52) U.S. Cl.
    CPC ........ *G11C 11/4091* (2013.01); *G11C 11/419* (2013.01); *G11C 11/4125* (2013.01); *G11C 11/565* (2013.01); *G11C 14/0054* (2013.01)

(56) References Cited

U.S. PATENT DOCUMENTS

| | | | |
|---|---|---|---|
| 8,410,838 | B2 | 4/2013 | Kato et al. |
| 8,432,187 | B2 | 4/2013 | Kato et al. |
| 8,618,586 | B2 | 12/2013 | Koyama et al. |
| 8,860,485 | B2 | 10/2014 | Kato et al. |
| 8,994,400 | B2 | 3/2015 | Kato et al. |
| 9,257,173 | B2 | 2/2016 | Ishizu et al. |
| 9,275,987 | B2 | 3/2016 | Matsuzaki |
| 9,299,432 | B2 | 3/2016 | Onuki et al. |
| 9,350,334 | B2 | 5/2016 | Kato et al. |
| 9,407,269 | B2 | 8/2016 | Koyama et al. |
| 9,443,564 | B2 | 9/2016 | Ishizu et al. |
| 9,627,010 | B2 | 4/2017 | Ishizu et al. |
| 9,640,255 | B2 | 5/2017 | Onuki et al. |
| 9,692,421 | B2 | 6/2017 | Kato et al. |
| 2010/0195363 | A1* | 8/2010 | Norman .......... G11C 5/02 365/51 |
| 2015/0091629 | A1* | 4/2015 | Ishizu .......... G11C 5/145 327/306 |
| 2015/0200657 | A1 | 7/2015 | Kato et al. |
| 2015/0294991 | A1 | 10/2015 | Ishizu |
| 2016/0226471 | A1 | 8/2016 | Kato et al. |
| 2017/0033128 | A1 | 2/2017 | Koyama et al. |
| 2017/0062044 | A1 | 3/2017 | Ishizu et al. |
| 2017/0194048 | A1 | 7/2017 | Ishizu et al. |

\* cited by examiner

STORAGE DEVICE, METHOD FOR OPERATING STORAGE DEVICE, SEMICONDUCTOR DEVICE, ELECTRONIC COMPONENT, AND ELECTRONIC DEVICE

BACKGROUND OF THE INVENTION

1. Field of the Invention

The specification, drawings, and claims of the present invention (hereinafter referred to as "this specification and the like") relate to a storage device, a method for operating the storage device, a semiconductor device, an electronic component, and an electronic device. Note that one embodiment of the present invention is not limited to the above technical field.

2. Description of the Related Art

The reduction in power consumption of electronic devices has been highly required. Thus, the reduction in power consumption of integrated circuits (ICs) such as CPUs is a major challenge in circuit design. The power consumption of ICs is broadly classified into operating power consumption (dynamic power) and non-operating (standby) power consumption (static power). Dynamic power increases when operating frequency increases for high performance. Static power is power consumed mostly by the leakage current of transistors. Examples of leakage current include subthreshold leakage current, gate tunnel leakage current, gate-induced drain leakage (GIDL) current, and junction tunnel leakage current. These leakage currents increase in accordance with scaling down of transistors. Thus, the increase in power consumption is a large barrier to high performance and high integration of ICs.

In order to reduce the power consumption of a semiconductor device, circuits that do not need to operate are stopped by power gating or clock gating. Power gating has the effect of eliminating standby power because power supply is stopped. In order to perform power gating in a CPU, it is necessary to back up data stored in a register or a cache to a nonvolatile memory.

A transistor including a metal oxide in a channel formation region (hereinafter such a transistor is referred to as an oxide semiconductor transistor or an OS transistor in some cases) is known. By taking advantage of extremely low off-state current of the OS transistor, a backup circuit capable of retaining data even when powered off has been proposed. For example, Patent Document 1 and Non-Patent Document 1 each disclose a static random access memory (SRAM) including a backup circuit that includes an OS transistor.

REFERENCES

[Patent Document]
Patent Document 1: Japanese Published Patent Application No. 2014-160526

Non-Patent Document

Non-Patent Document 1: T. Ishizu et al., "SRAM with C-Axis Aligned Crystalline Oxide Semiconductor: Power Leakage Reduction Technique for Microprocessor Caches," *Int. Memory Workshop,* 2014, pp. 103-106.

SUMMARY OF THE INVENTION

An object of one embodiment of the present invention is to provide a storage device capable of performing power gating, to reduce the area of a backup circuit, or to provide a low-power electronic component.

The description of a plurality of objects does not disturb the existence of each object. One embodiment of the present invention does not necessarily achieve all the objects described above. Other objects will be apparent from the description of this specification and the like, and such objects could be objects of one embodiment of the present invention.

(a1) One embodiment of the present invention is a storage device that includes a memory cell, a word line, a first bit line, a second bit line, a first wiring, and a precharge circuit. The memory cell includes a bistable circuit, a first transistor, a second transistor, and a backup circuit. The bistable circuit includes a first node and a second node. The first transistor has a function of controlling electrical continuity between the first bit line and the first node. The second transistor has a function of controlling electrical continuity between the second bit line and the second node. A gate of the first transistor and a gate of the second transistor are electrically connected to the word line. The backup circuit has a function of backing up data of one of the first node and the second node. The backup circuit includes a retention node, an input node, an output node, a third transistor, a fourth transistor, and a capacitor. The third transistor includes a metal oxide in a channel formation region. A gate of the third transistor is electrically connected to a second wiring, a first terminal of the third transistor is electrically connected to the input node, and a second terminal of the third transistor is electrically connected to the retention node. A first terminal of the capacitor is electrically connected to the retention node, and a second terminal of the capacitor is electrically connected to the first wiring. A gate of the fourth transistor is electrically connected to the retention node, a first terminal of the fourth transistor is electrically connected to the output node, and a second terminal of the fourth transistor is electrically connected to the first wiring. The input node is electrically connected to one of the first node and the second node, and the output node is electrically connected to the other of the first node and the second node. The precharge circuit has a function of inputting first voltage to the first bit line and a function of inputting second voltage whose magnitude is different from magnitude of the first voltage to the second bit line.

(a2) One embodiment of the present invention is a storage device that includes a memory cell, a word line, a first bit line, a second bit line, a first wiring, and a precharge circuit. The memory cell includes a bistable circuit, a first transistor, a second transistor, and a backup circuit. The bistable circuit includes a first node and a second node. The first transistor has a function of controlling electrical continuity between the first bit line and the first node. The second transistor has a function of controlling electrical continuity between the second bit line and the second node. A gate of the first transistor and a gate of the second transistor are electrically connected to the word line. The backup circuit has a function of backing up data of one of the first node and the second node. The backup circuit includes a retention node, an input node, an output node, a third transistor, a fourth transistor, and a capacitor. The third transistor includes a metal oxide in a channel formation region. A gate of the third transistor is electrically connected to a second wiring, a first terminal of the third transistor is electrically connected to the input node, and a second terminal of the third transistor is electrically connected to the retention node. A first terminal of the capacitor is electrically connected to the retention node, and a second terminal of the capacitor is electrically connected to the first wiring. The input node and the output node are electrically connected to one of the first node and the second node. A gate of the fourth transistor is electrically connected to the retention node, a first terminal of the fourth transistor is electrically connected to the output node, and a second terminal of the fourth transistor is electrically connected to the first wiring. The precharge circuit has a function of inputting first voltage to the first bit line and a function of inputting second voltage whose magnitude is different from magnitude of the first voltage to the second bit line.

(a3) In the embodiment (a1) or (a2), the storage device includes a third wiring. The backup circuit includes a fifth transistor. The fifth transistor has a function of controlling electrical continuity between the first terminal of the fourth transistor and the output node. A gate of the fifth transistor is electrically connected to the third wiring.

(a4) In the embodiment (a1) or (a2), the storage device includes a fourth wiring. The second terminal of the capacitor is electrically connected to the fourth wiring.

(b1) One embodiment of the present invention is a method for operating the storage device according to the embodiment (a1) or (a2). The precharge circuit performs precharge operation where the first voltage is input to the first bit line and the second voltage is input to the second bit line while supply of power supply voltage to the bistable circuit is stopped. Third voltage is input to the word line to turn on the first transistor and the second transistor during the precharge operation. The supply of the power supply voltage to the bistable circuit is started after the first transistor and the second transistor are turned off.

(b2) One embodiment of the present invention is a method for operating the storage device according to the embodiment (a3). The precharge circuit performs precharge operation where the first voltage is input to the first bit line and the second voltage is input to the second bit line while supply of power supply voltage to the bistable circuit is stopped. Third voltage is input to the word line to turn on the first transistor and the second transistor during the precharge operation. Fourth voltage is input to the third wiring to turn on the fifth transistor after the first transistor and the second transistor are turned off. The supply of the power supply voltage to the bistable circuit is started while the fifth transistor is on.

(b3) One embodiment of the present invention is a method for operating the storage device according to the embodiment (a4). The precharge circuit performs precharge operation where the first voltage is input to the first bit line and the second voltage is input to the second bit line while supply of power supply voltage to the bistable circuit is stopped. Third voltage is input to the word line to turn on the first transistor and the second transistor during the precharge operation. Fifth voltage higher than voltage of the first wiring is input to the fourth wiring after the first transistor and the second transistor are turned off. The supply of the power supply voltage to the bistable circuit is started while the fifth voltage is input to the third wiring.

In this specification and the like, ordinal numbers such as "first," "second," and "third" are used to show the order in some cases. Alternatively, ordinal numbers such as "first," "second," and "third" are used to avoid confusion among components in some cases, and do not limit the number or order of components. For example, it is possible to replace the term "first" with the term "second" or "third" in describing one embodiment of the present invention.

In this specification and the like, description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts. Each of X and Y denotes an object (e.g., a device, an element, a circuit, a wiring, an electrode, a terminal, a conductive film, or a layer).

A transistor is an element having three terminals: a gate, a source, and a drain. The gate is a terminal that functions as a control node for controlling the on/off state of the transistor. Depending on the type of the transistor or levels of potentials applied to the terminals, one of two input/output terminals functions as a source and the other functions as a drain. Therefore, the terms "source" and "drain" can be interchanged with each other in this specification and the like. In this specification and the like, two terminals except a gate are referred to as a first terminal and a second terminal in some cases.

Voltage refers to a potential difference between a given potential and a reference potential (e.g., a ground potential (GND) or a source potential) in many cases. Thus, voltage can also be referred to as a potential. Note that a potential has a relative value. Accordingly, GND does not necessarily mean 0 V.

A node can be referred to as a terminal, a wiring, an electrode, a conductive layer, a conductor, an impurity region, or the like depending on a circuit structure, a device structure, and the like. Furthermore, a terminal, a wiring, or the like can also be referred to as a node.

In this specification and the like, the terms "film" and "layer" can be interchanged with each other depending on circumstances or conditions. For example, the term "conductive layer" can be changed into the term "conductive film" in some cases. The term "insulating film" can be changed into the term "insulating layer" in some cases, for example.

In this specification and the like, a semiconductor device refers to a device that utilizes semiconductor characteristics, and means a circuit including a semiconductor element (e.g., a transistor, a diode, or a photodiode), a device including the circuit, and the like. The semiconductor device also means any device that can function by utilizing semiconductor characteristics. For example, an integrated circuit, a chip including an integrated circuit, and an electronic component including a chip in a package are examples of semiconductor devices. Moreover, a storage device, a display device, a light-emitting device, a lighting device, an electronic device, and the like themselves might be semiconductor devices, or might each include a semiconductor device.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in a channel formation region of a transistor is called an oxide semiconductor in some cases.

In this specification and the like, a metal oxide including nitrogen is used in a channel formation region of a transistor, unless otherwise specified. Moreover, a metal oxide including nitrogen may be called a metal oxynitride.

According to one embodiment of the present invention, it is possible to provide a storage device capable of performing power gating, to reduce the area of a backup circuit, or to provide a low-power electronic component.

The description of a plurality of effects does not disturb the existence of other effects. In one embodiment of the present invention, there is no need to obtain all the effects described above. In one embodiment of the present invention, other objects, effects, and novel features will be apparent from the description of the specification and the drawings.

DETAILED DESCRIPTION OF THE INVENTION

Figure 1A:
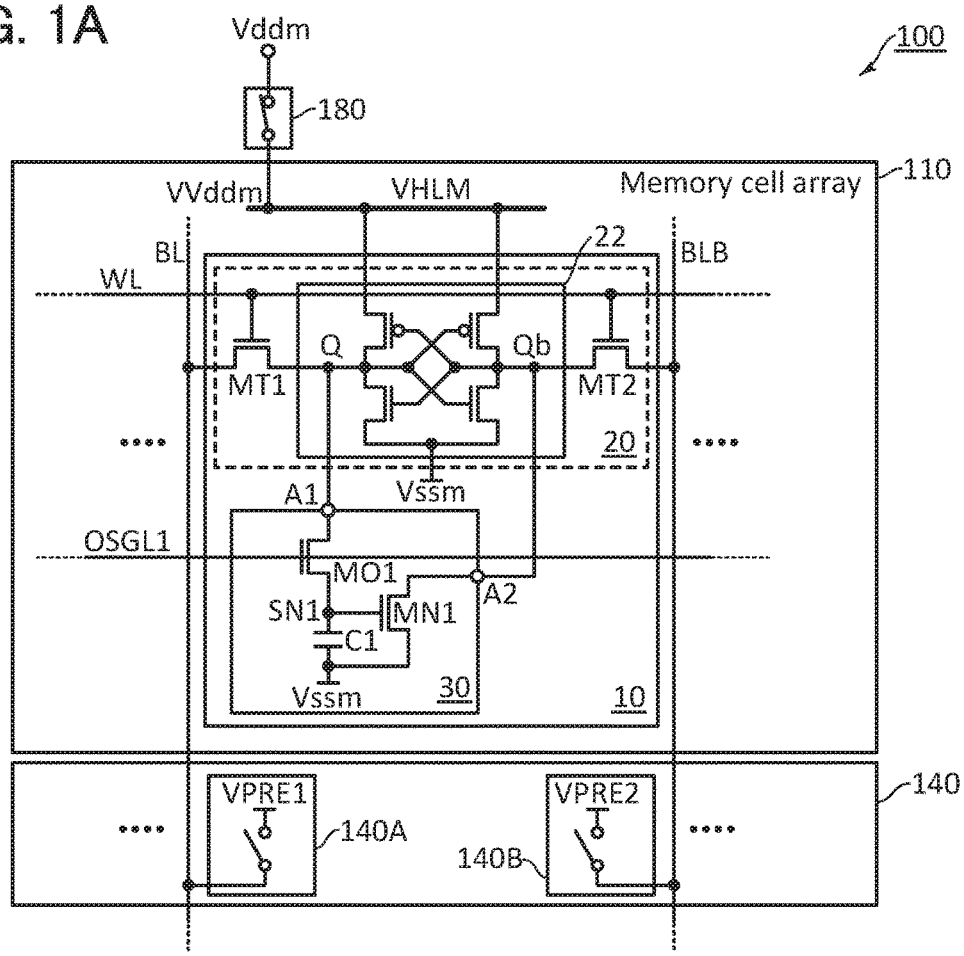
FIG. 1A is a circuit diagram illustrating a structure example of a storage device and FIG. 1B is a timing chart showing an operation example of the storage device.

Embodiments of the present invention will be described below. Note that one embodiment of the present invention is not limited to the following description. It will be readily appreciated by those skilled in the art that modes and details of the present invention can be modified in various ways without departing from the spirit and scope of the present invention. One embodiment of the present invention therefore should not be construed as being limited to the following description of the embodiments.

Any of the embodiments described below can be combined as appropriate. In addition, in the case where a plurality of structure examples (including a manufacturing method example, an operating method example, and the like) are given in one embodiment, some of the structure examples can be combined as appropriate, and any of the structure examples can be combined with one or more structure examples described in the other embodiments.

The same components, components having similar functions, components formed using the same material, components formed at the same time, and the like in the drawings are denoted by the same reference numerals, and the description thereof is not repeated in some cases.

In the drawings, the size, the layer thickness, the region, and the like are exaggerated for clarity in some cases. Thus, embodiments of the present invention are not limited to such scales. The drawings are schematic views showing ideal examples, and embodiments of the present invention are not limited to shapes or values shown in the drawings. For example, the following can be included: variation in signal, voltage, or current due to noise or difference in timing.

In this specification, terms for describing arrangement, such as "over," "above," "under," and "below" are used for convenience for describing the positional relationship between components with reference to drawings in some cases. Furthermore, the positional relationship between components is changed as appropriate in accordance with a direction in which each component is described. Thus, there is no limitation on terms used in this specification, and description can be made appropriately depending on the situation.

Embodiment 1

In this embodiment, an SRAM capable of performing power gating is disclosed as an example of a storage device.
<Storage Device 100>

FIG. 1A illustrates a structure example of a storage device. A storage device 100 includes a memory cell array 110, a precharge circuit 140, and a power switch 180.

The memory cell array 110 includes a memory cell 10, a word line WL, bit lines BL and BLB, a wiring OSGL1, a virtual power supply line VHLM, and a power supply line for voltage Vssm. FIG. 1A illustrates a structure example of the memory cell array 110 in one row and one column. However, the memory cell array 110 includes a plurality of memory cells 10 arranged in a matrix, and includes the word line WL, the bit lines BL and BLB, and the wiring OSGL1 depending on the arrangement of the memory cells 10.

Note that a pair of wirings that is made up of the bit lines BL and BLB arranged in the same column is referred to as a pair of bit lines BL and BLB in some cases.

The power switch 180 is provided between an input terminal for voltage Vddm and the virtual power supply line VHLM (hereinafter referred to as a power supply line VHLM). Voltage VVddm is virtual power supply voltage to be supplied to the power supply line VHLM through the power switch 180. Note that the voltage Vddm is high-level power supply voltage, and the voltage Vssm is low-level power supply voltage. The storage device 100 may include a power switch for controlling supply of the voltage Vssm to a memory cell 20.

(Memory Cell 10)

The memory cell 10 includes a bistable circuit 22, transistors MT1 and MT2, and a backup circuit 30. The bistable circuit 22 is formed using an inverter loop of two CMOS inverters. Connection portions of input terminals and output terminals of the two CMOS inverters are nodes Q and Qb for retaining complementary data. When the nodes Q and Qb are set to "H" (high level) and "L" (low level) or "L" and "H," respectively, the bistable circuit 22 is stabilized.

In the example of FIG. 1A, the memory cell 20 includes the bistable circuit 22 and the transistors MT1 and MT2. The memory cell 20 has the same circuit structure as a general single-port SRAM memory cell. The transistors MT1 and MT2 function as transfer transistors of the memory cell 20. The transistor MT1 controls electrical continuity between the bit line BL and the node Q. The transistor MT2 controls electrical continuity between the bit line BLB and the node Qb.

(Backup Circuit 30)

The backup circuit 30 is a circuit for backing up data of the memory cell 20 during power gating of the memory cell array 110. The backup circuit 30 includes nodes A1, A2, and SN1, transistors MO1 and MN1, and a capacitor C1.

The node SN1 is a retention node for retaining data. The node A1 is a data input node to which data (also can be referred to as a state) of the memory cell 20 is input. The node A2 is an output node of data retained in the backup circuit 30. The node A1 is electrically connected to the node Q, and the node A2 is electrically connected to the node Qb. In the example of FIG. 1A, the backup circuit 30 has a function of storing data of the node Q and loading the stored data to the node Qb.

The transistor MO1 functions as a path transistor that controls electrical continuity between the node A1 and the node SN1. The capacitor C1 is a storage capacitor for holding the voltage of the node SN1. The transistor MN1 functions as a read transistor for reading data of the node SN1 to the node A2.

In order to retain data in the backup circuit 30 for a long time, a transistor whose off-state current is extremely low is selected as the transistor MO1. An OS transistor is preferably used as the transistor MO1. When an OS transistor is used as the transistor MO1, leakage of electric charge from the capacitor C1 can be suppressed, so that the backup circuit 30 can retain data for a long time.

A metal oxide has a bandgap of greater than equal to 3.0 eV; thus, an OS transistor has low leakage current due to thermal excitation and, as described above, extremely low off-state current. The off-state current of the OS transistor that is normalized by channel width can be reduced to a range of approximately a few yoctoamperes per micrometer to a few zeptoamperes per micrometer. Examples of a metal oxide that can be used in a channel formation region include Zn oxide, Zn—Sn oxide, Ga—Sn oxide, In—Ga oxide, In—Zn oxide, and In-M-Zn oxide (M is Ti, Ga, Y, Zr, La, Ce, Nd, Sn or Hf). In addition, an oxide containing indium and zinc may contain one or more kinds of elements selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like.

When the transistor MO1 is an OS transistor, the transistor MO1 can be stacked over the memory cell 20 including a Si transistor; thus, the area overhead of the memory cell 10 due to addition of the backup circuit 30 can be reduced. In addition, the transistor MN1 is an n-channel transistor and thus can be an OS transistor. When both the transistors MO1 and MN1 are OS transistors, the area overhead can be further reduced.

(Precharge Circuit 140)

The precharge circuit 140 includes precharge circuits 140A and 140B. The precharge circuit 140A has a function of precharging the bit line BL with voltage VPRE1, and the precharge circuit 140B has a function of precharging the bit line BLB with voltage VPRE2. For example, the precharge circuit 140A includes a switch provided between a power supply line for the voltage VPRE1 and the bit line BL, and the precharge circuit 140B includes a switch provided between a power supply line for the voltage VPRE2 and the bit line BLB.

The precharge circuit 140 is activated in recovery operation and is provided to apply different precharge voltages to the nodes Q and Qb. In the example of FIG. 1A, VPRE1<VPRE2 is satisfied.

<Operation Example of Storage Device 100>

Figure 1B:
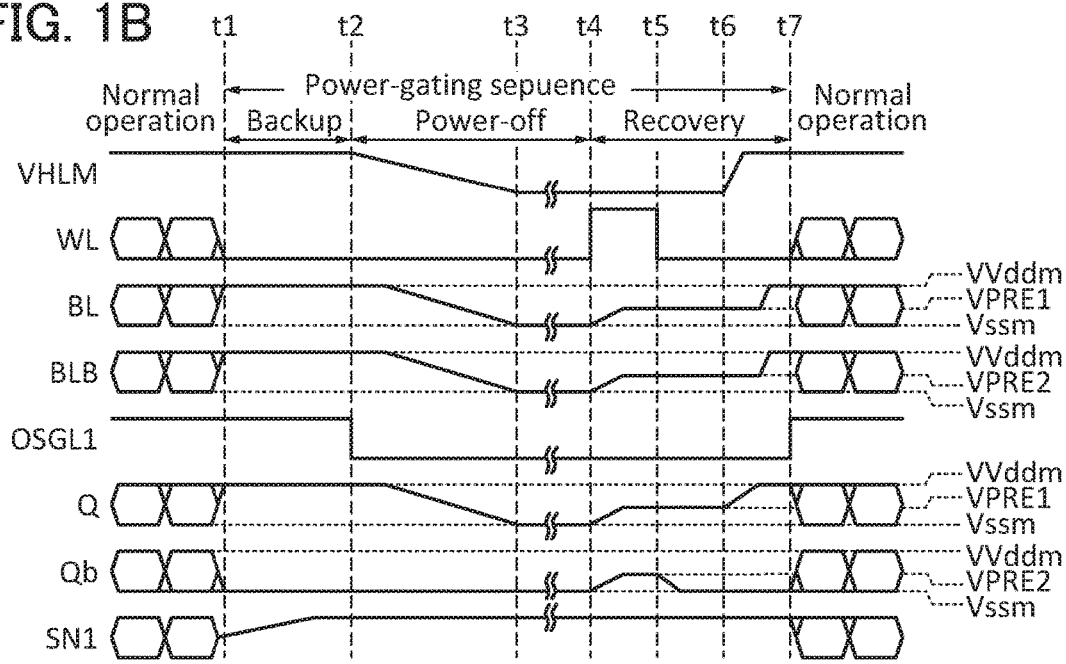

An operation example of the storage device 100 is described with reference to FIG. 1B. FIG. 1B is a timing chart showing an operation example of the storage device 100. In FIG. 1B, t1, t2, and the like each represent time.

<Normal Operation>

In a period before t1, the storage device 100 performs normal operation and operates as a single-port SRAM. In the normal operation, the wiring OSGL1 is set to "H" to make the transistor MO1 always on. Thus, in the backup circuit 30, the state of the node SN1 is updated to the same state as the node Q. Note that in the backup circuit 30, data is rewritten by charging and discharging of the capacitor C1; thus, the number of data rewritings is not limited and data can be rewritten at low energy.

<Power Gating Sequence>

In a period from t1 to t7, the memory cell array 110 is power-gated. The power gating sequence of the memory cell array 110 includes backup operation, power-off operation, and recovery operation.

(Backup Operation)

The backup operation is started by setting the word lines WL in all the rows to "L." Thus, the bistable circuit 22 is electrically isolated from the pair of bit lines BL and BLB. Since the wiring OSGL1 remains "H," data of the node Q at the time t1 is rewritten to the backup circuit 30 in a period from t1 to t2.

Note that in the example of FIG. 1A, the backup circuit 30 always performs the backup operation in the normal operation; thus, the backup operation can be omitted. In the case where the operating frequency of the storage device 100 is high, preferably, the backup operation is performed and the data of the node Q at the time t1 is written to the backup circuit 30 more reliably.

The wiring OSGL1 is set to "L" at the time t2, so that the backup operation is finished and the power-off operation is started. When the wiring OSGL1 is set to "L," the node SN1 becomes electrically floating and the backup circuit 30 retains data.

(Power-Off Operation)

Here, the states of the nodes Q and Qb at t1 are "H" and "L," respectively. In the case where supply of the voltage Vddm to the memory cell array 110 is stopped by the power switch 180 at t2, the power supply line VHLM is discharged. When the voltage of the power supply line VHLM is decreased, the bistable circuit 22 is deactivated to lose the data of the nodes Q and Qb; however, the node SN1 keeps retaining the data of the node Q at the time t1. Note that in a period from t3 to t4, supply of power to a peripheral circuit for driving the memory cell array 110 may be stopped.

(Recovery Operation)

The recovery operation is operation for recovering the state of the bistable circuit 22 to the state at the time t1 by writing the data retained in the node SN1 to the node Qb of the bistable circuit 22.

The precharge circuit 140 is activated in a period from t4 to t5 to precharge the nodes Q and Qb with the voltages VPRE1 and VPRE2, respectively. The word line WL is "H" in the period from t4 to t5. The voltages of the bit lines BL and BLB are applied to the nodes Q and Qb, respectively, because the transistors MT1 and MT2 are on. Thus, the voltages of the nodes Q and Qb are set to VPRE1 and VPRE2, respectively.

When the word line WL is set to "L" at t5, the node Q becomes electrically floating; thus, the voltage of the node Q remains VPRE1. The voltage of the node Qb is determined by data retained in the node SN1. In an example of FIG. 1B, the node SN1 is "H," so that the transistor MN1 is on and the voltage of the node Qb is decreased from VPRE2 to Vssm. Consequently, the voltage of the node Q (=VPRE1)>the voltage of the node Qb (=Vssm) is satisfied.

When the power switch 180 is turned on at t6, the power supply line VHLM is charged with the voltage VVddm. When the bistable circuit 22 is activated, the voltage of the node Q is set to VVddm and the voltage of the node Qb is set to Vssm. In other words, the states of the nodes Q and Qb are recovered to the states at t1, i.e., "H" and "L," respectively.

Note that in the case where the node Q is "L" at t1, the node SN1 is "L" in a period from t1 to t7, so that the transistor MN1 is off. Thus, the voltages of the nodes Q and Qb in a period from t5 to t6 remain voltages set by the precharge circuit 140. In other words, the voltage of the node Q (=VPRE1)<the voltage of the node Qb (=VPRE2) is satisfied. When the power switch 180 is turned on at the time t6 and then the bistable circuit 22 is activated, the states of the nodes Q and Qb are recovered to the states at t1, i.e., "L" and "H," respectively.

As described above, in the operation example of FIG. 1B, the data of each of the nodes Q and Qb is recovered by a piece of data retained in the node SN1 by applying the different precharge voltages VPRE1 and VPRE2 to the nodes Q and Qb before activating the bistable circuit 22 in the recovery operation.

In the structure example of FIG. 1A, VPRE1<VPRE2 is satisfied; however, in the case where the node A1 is electrically connected to the node Qb and the node A2 is electrically connected to the node Q, VPRE1>VPRE2 is satisfied.

Some other structure examples of a storage device are described below.

<Storage Device 101>

Figure 2:
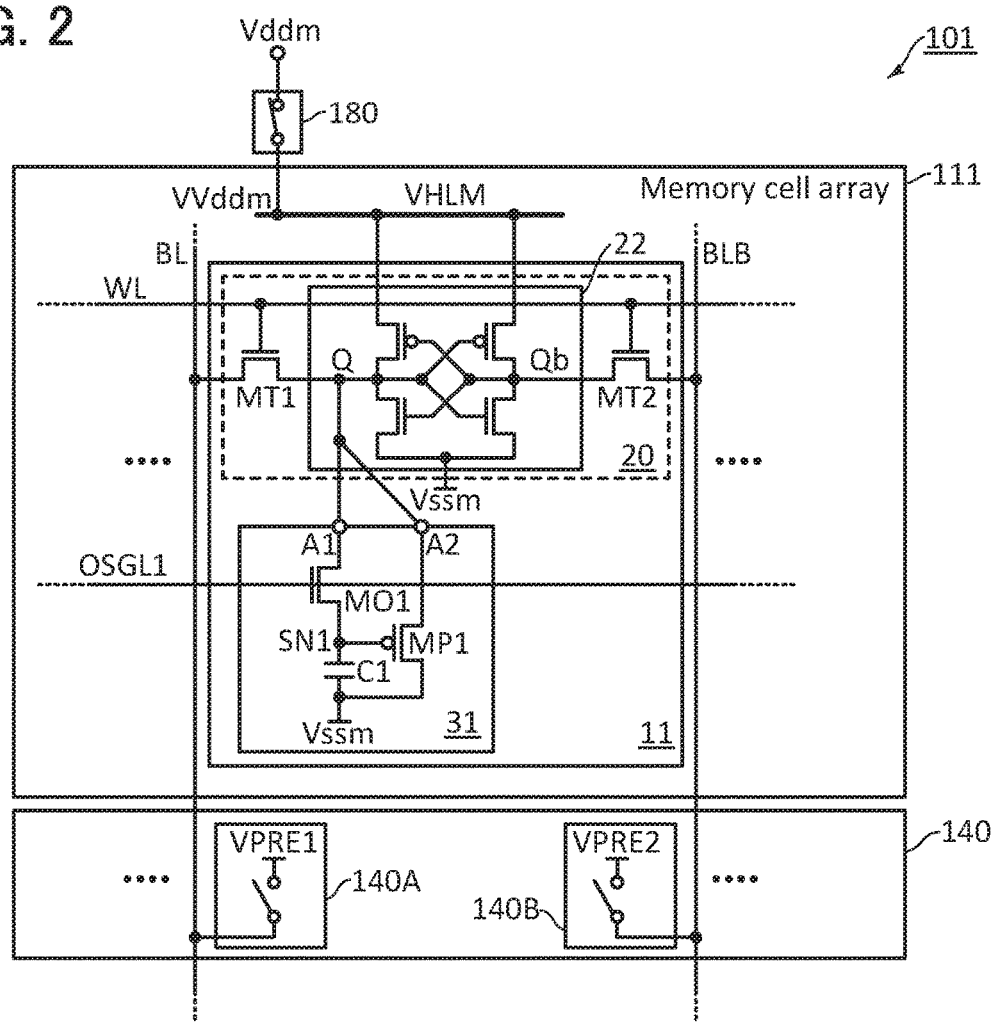
FIG. 2 is a circuit diagram illustrating a structure example of a storage device.

A storage device 101 in FIG. 2 includes a memory cell array 111 including a memory cell 11. The memory cell 11 includes the memory cell 20 and a backup circuit 31. The backup circuit 31 is a modification example of the backup circuit 30. In the backup circuit 31, a transistor MP1 is provided instead of the transistor MN1. The nodes A1 and A2 of the backup circuit 31 are electrically connected to the node Q.

The storage device 101 can operate in accordance with the timing chart in FIG. 1B. In the circuit structure of FIG. 2, VPRE1>VPRE2 is satisfied. In the case where the nodes A1 and A2 are electrically connected to the node Qb, VPRE1<VPRE2 is satisfied.

<Storage Device 102>

Figure 3A:
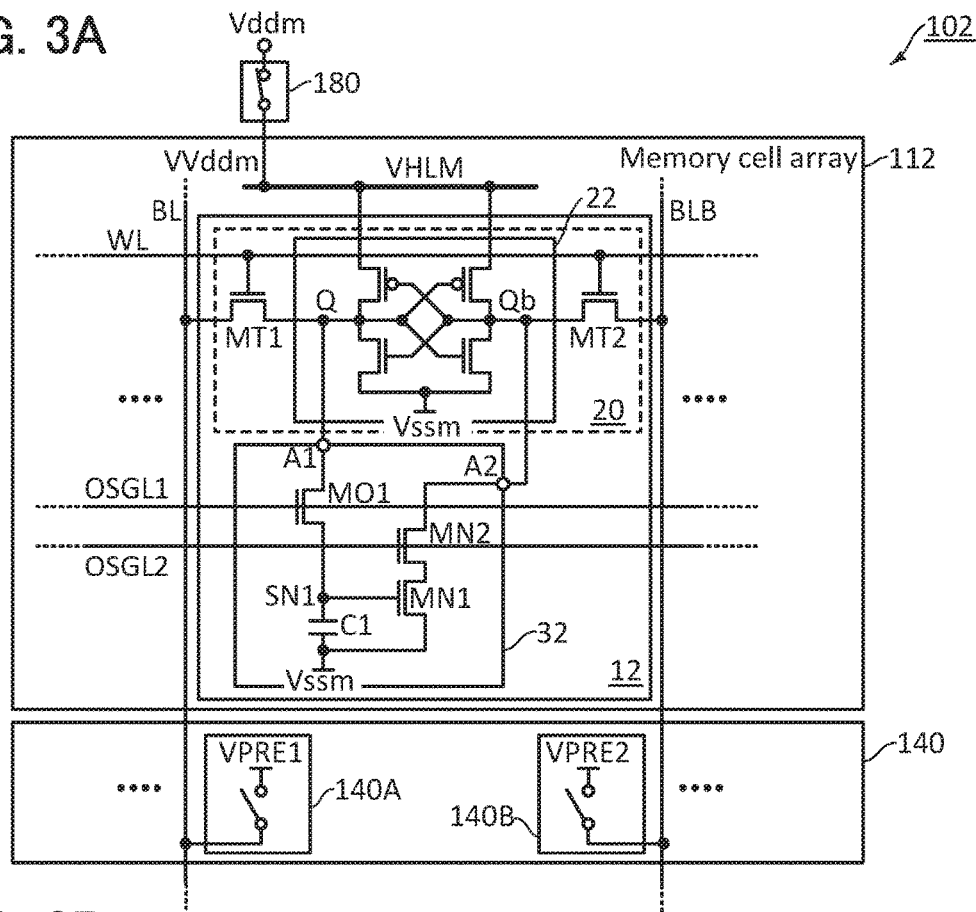
FIG. 3A is a circuit diagram illustrating a structure example of a storage device and FIG. 3B is a timing chart showing an operation example of the storage device.

A storage device 102 in FIG. 3A includes a memory cell array 112 including a memory cell 12. The memory cell array 112 further includes a wiring OSGL2. The memory cell 12 includes the memory cell 20 and a backup circuit 32.

The backup circuit 32 is obtained by addition of a transistor MN2 to the backup circuit 30. The transistor MN2 is electrically connected to the transistor MN1 in series. A gate of the transistor MN2 is electrically connected to the wiring OSGL2. The transistor MN2 may be either a Si transistor or an OS transistor.

In the circuit structure of FIG. 3A, VPRE1<VPRE2 is satisfied. In the case where the nodes A1 and A2 are electrically connected to the nodes Qb and Q, respectively, VPRE2<VPRE1 is satisfied.

Figure 3B:
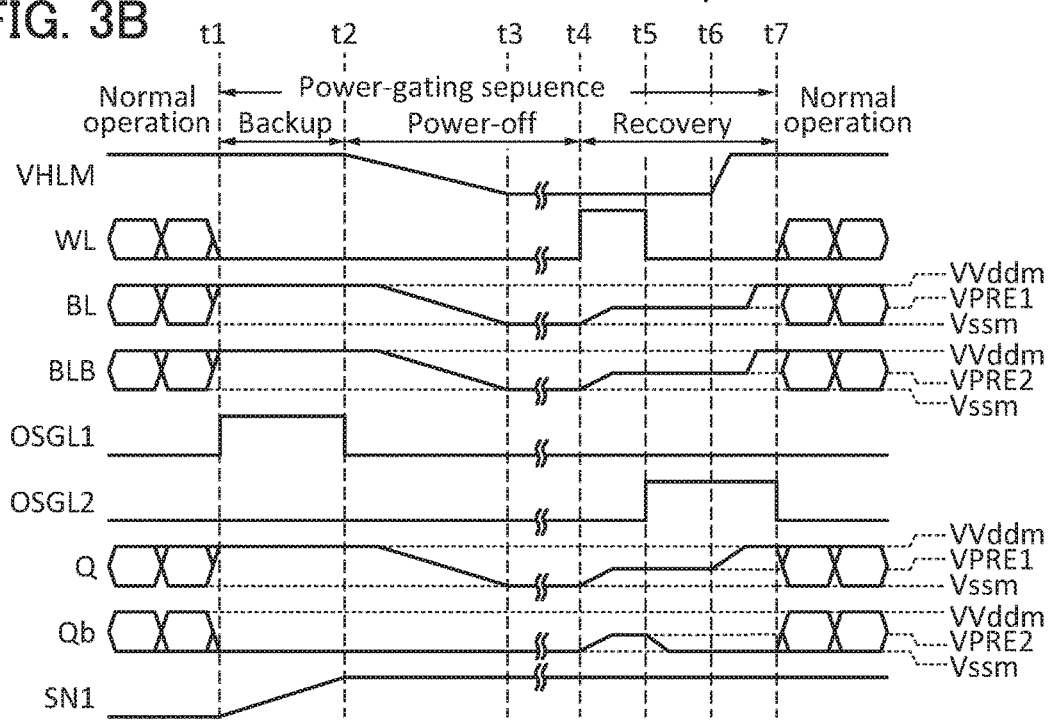

FIG. 3B shows an operation example of the storage device 102. Here, points different from those of the operation example of the storage device 100 are mainly described.

(Normal Operation)

During normal operation, the wirings OSGL1 and OSGL2 are set to "L," so that electrical continuity is not established between the nodes A1 and Q, and electrical continuity is not established between the nodes A2 and Qb. Consequently, unlike in the storage device 100, the memory cell 20 can be electrically isolated from the backup circuit 32 in the storage device 102 during normal operation; thus, degradation of read speed and write speed of the memory cell 20 due to addition of the backup circuit 32 can be negligibly small.

(Backup Operation)

The states of the nodes Q and Qb at t1 are "H" and "L," respectively, in the example of FIG. 3B. When the wiring OSGL1 is set to "H," the data of the node Q is written to the node SN1 and the node SN1 is set to "H." When the wiring OSGL1 is set to "L" at t2, the backup operation is completed and the backup circuit 32 retains data. The state of the node SN1 is not updated until the next backup operation is performed (i.e., the wiring OSGL1 is set to "H").

(Recovery Operation)

Precharge operation similar to that of the storage device 100 is performed in a period from t4 to t5, the voltage VPRE1 is applied to the node Q, and the voltage VPRE2 is applied to the node Qb. When the wiring OSGL2 is set to "H," voltage based on the state of the node SN1 is applied to the node Qb. Since the node SN1 is "H" in FIG. 3B, the transistors MN1 and MN2 are on. The voltage of the node Qb is set to Vssm, and the voltage of the node Q (=VPRE1)>the voltage of the node Qb (=Vssm) is satisfied. After that, when the bistable circuit 22 is activated, the nodes Q and Qb are recovered to the states at the time t1, i.e., "H" and "L," respectively.

Note that when the states of the nodes Q and Qb at the time t1 are "L" and "H," respectively, the node SN1 is set to "L" by the backup operation. Thus, even when the wiring OSGL2 is set to "H" after the nodes Q and Qb are precharged with VPRE1 and VPRE2, respectively, the voltages of the nodes Q and Qb are not changed. Since VPRE1<VPRE2 is satisfied, the states of the nodes Q and Qb are recovered to "L" and "H," respectively, when the bistable circuit 22 is activated.

The transistor MN2 in the backup circuit 32 may be a p-channel transistor. In that case, in the operation example of FIG. 3B, the wiring OSGL2 is set to "L" in a backup period (from t5 to t6) and is set to "H" in a normal operation period and the backup period. In a power-off period, OSGL2 may be set to "L" or may be floating.

<Storage Device 103>

Figure 4:
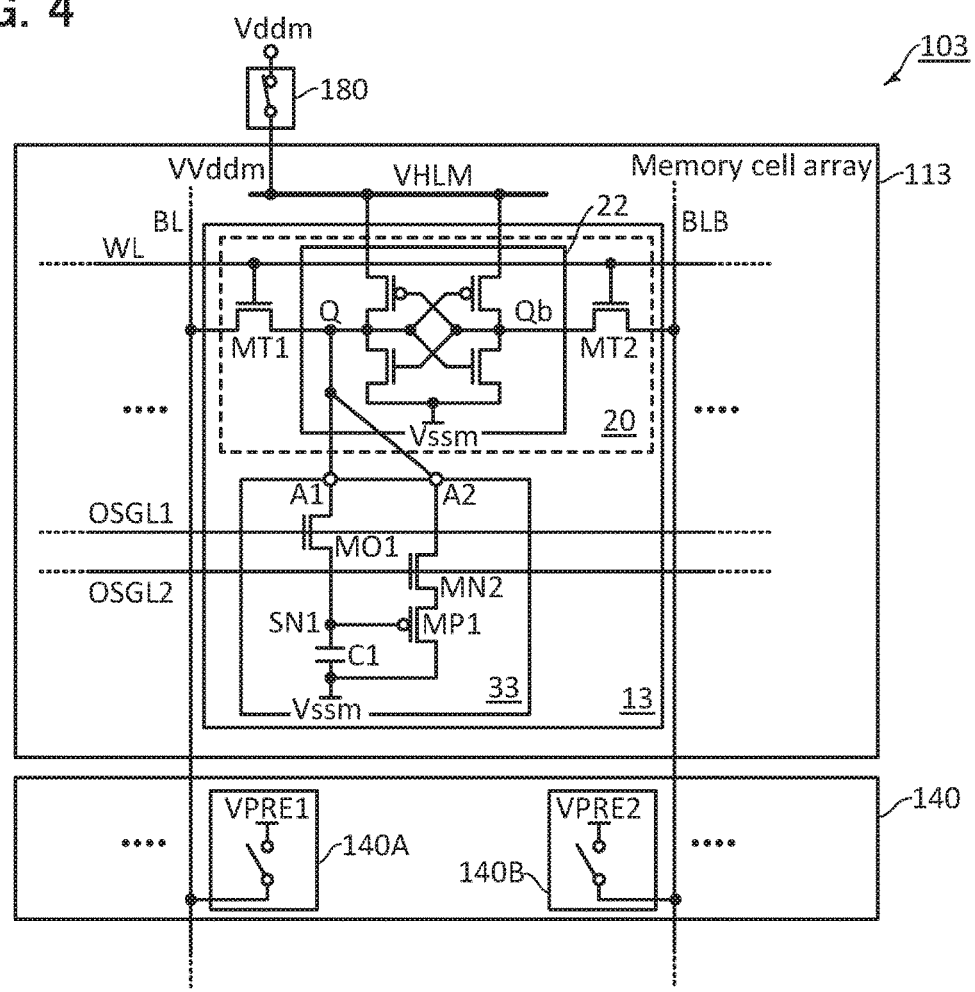
FIG. 4 is a circuit diagram illustrating a structure example of a storage device.

A storage device 103 in FIG. 4 is a modification example of the storage device 102, which includes a memory cell array 113 including a memory cell 13. The memory cell 13 includes the memory cell 20 and a backup circuit 33. The backup circuit 33 is a modification example of the backup circuit 32. In the backup circuit 33, the transistor MP1 is provided instead of the transistor MN1. The nodes A1 and A2 are electrically connected to the node Q.

The storage device 103 can operate in accordance with the timing chart in FIG. 3B. In the circuit structure of FIG. 4, VPRE1>VPRE2 is satisfied. In the case where the nodes A1 and A2 are electrically connected to the node Qb, VPRE1<VPRE2 is satisfied.

The transistor MN2 in the backup circuit 33 may be a p-channel transistor. In that case, in the operation example of FIG. 3B, the wiring OSGL2 is set to "L" in the backup period (from t5 to t6) and is set to "H" in the normal operation period and the backup period. In the power-off period, OSGL2 may be set to "L" or may be floating.

<Storage Device 104>

Figure 5A:
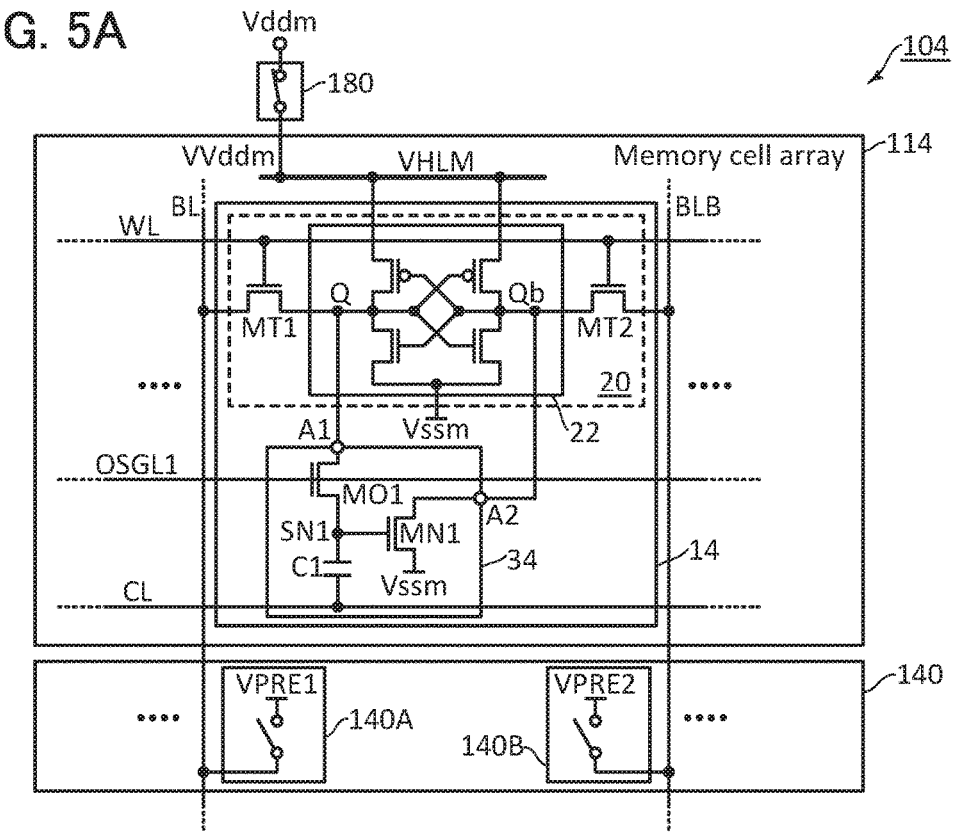
FIG. 5A is a circuit diagram illustrating a structure example of a storage device and FIG. 5B is a timing chart showing an operation example of the storage device.

A storage device 104 in FIG. 5A is a modification example of the storage device 100. The storage device 104 includes a memory cell array 114 including a memory cell 14. The memory cell array 114 further includes a wiring CL. The memory cell 14 includes the memory cell 20 and a backup circuit 34. The backup circuit 34 is a modification example of the backup circuit 30. In the backup circuit 34, a terminal of the capacitor C1 is electrically connected to the wiring CL.

In the circuit structure of FIG. 5A, VPRE1<VPRE2 is satisfied. In the case where the nodes A1 and A2 are electrically connected to the nodes Qb and Q, respectively, VPRE2<VPRE1 is satisfied.

Figure 5B:
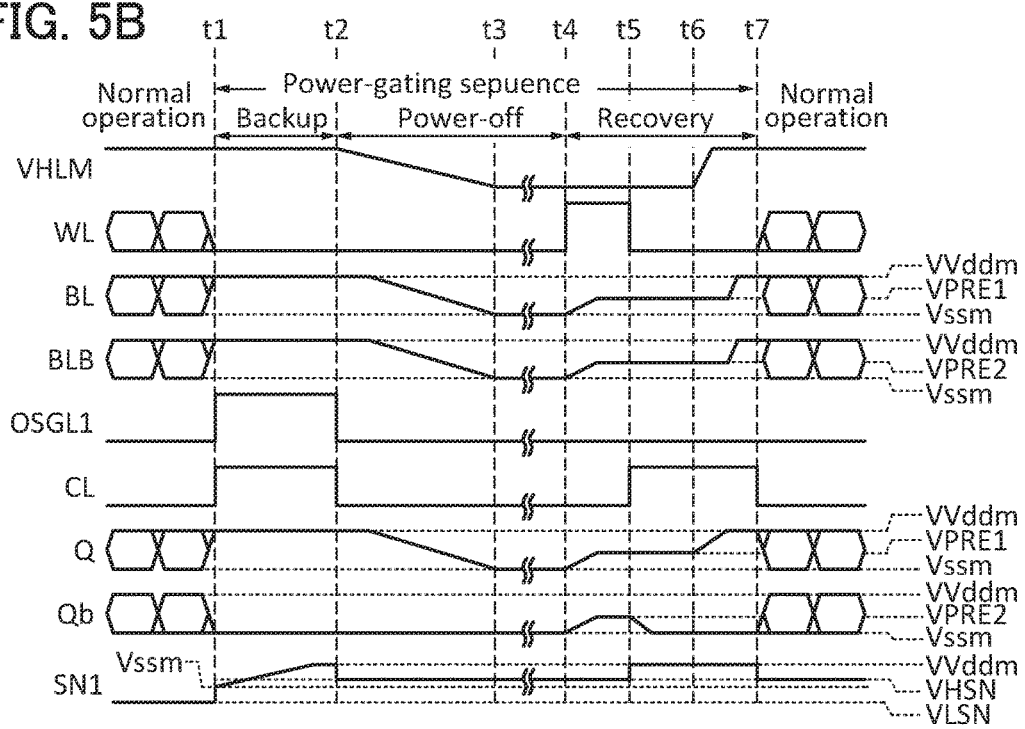

FIG. 5B shows an operation example of the storage device 104. Here, points different from those of the operation example of the storage device 100 are mainly described.

(Normal Operation)

During normal operation, the wirings OSGL1 and CL are set to "L." The transistors MO1 and MN1 are off before time t1; thus, the memory cell 20 is electrically isolated from the backup circuit 34.

(Backup Operation)

The states of the nodes Q and Qb at t1 are "H" and "L," respectively, in the example of FIG. 5B. When the wiring CL is set to "H," the voltage of the node SN1 is increased from VLSN to Vssm. When the wiring OSGL1 is set to "H," the transistor MO1 is turned on, data "H" of the node Q is written to the node SN1, and the voltage of the node SN1 is further increased to VVddm.

When the wiring OSGL1 is set to "L" at t2, the node SN1 becomes electrically floating. In addition, when the wiring CL is set to "L," the voltage of the node SN1 is decreased to VHSN. Note that when the voltage of the node SN1 is VHSN, the voltage of the wiring CL is set such that the transistor MN1 is off. For example, the low-level voltage and high-level voltage of the wiring CL can be VLSN or Vssm and VHSN or Vddm, respectively.

Note that in the case where data "L" is written to the node SN1 in the backup operation, when the wiring CL is set to "L" at time t2, the voltage of the node SN1 is decreased from Vssm to VLSN.

(Recovery Operation)

Precharge operation similar to that of the storage device 100 is performed in a period from t4 to t5, VPRE1 is applied to the node Q, and VPRE2 is applied to the node Qb. When the wiring CL is set to "H" in a period from t5 to t6, voltage based on the state of the node SN1 is applied to the node Qb. Since the voltage of the node SN1 is VVddm in FIG. 5B, the transistor MN1 is on. The voltage of the node Qb is set to Vssm, and the voltage of the node Q (=VPRE1)>the voltage of the node Qb (=Vssm) is satisfied. Thus, when the bistable circuit 22 is activated, the nodes Q and Qb are recovered to the states at the time t1, i.e., "H" and "L," respectively.

Note that when the states of the nodes Q and Qb at the time t1 are "L" and "H," respectively, the data "L" is written to the node SN1 by the backup operation. The voltage of the node SN1 in a power-off period is VLSN. Thus, when the wiring CL is set to "H" after the nodes Q and Qb are precharged with VPRE1 and VPRE2, respectively, the voltage of the node SN1 is increased from VLSN to Vssm; however, the voltages of the nodes Q and Qb are not changed because the transistor MN1 remains off. Since VPRE1<VPRE2 is satisfied, the states of the nodes Q and Qb are recovered to "L" and "H," respectively, when the bistable circuit 22 is activated.

(Normal Operation)

The storage device 104 performs normal operation after t7. The data of the node SN1 is not updated until the next backup operation is performed. Although the voltage of the node SN1 is VHSN, the transistor MN1 is off. Thus, even when the state of the node SN1 is "H" in normal operation, the memory cell 20 can be electrically isolated from the backup circuit 34. Consequently, degradation of read speed and write speed of the memory cell 20 due to addition of the backup circuit 34 can be negligibly small.

<Storage Device 105>

Figure 6:
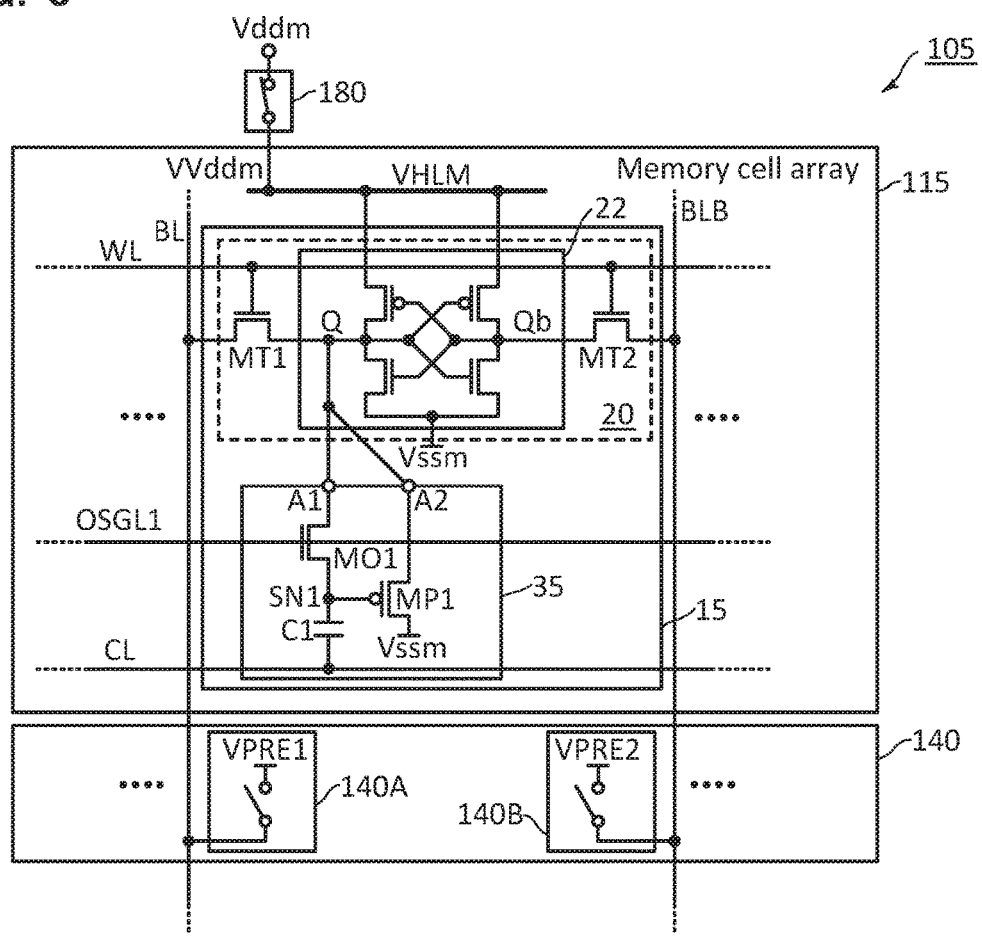
FIG. 6 is a circuit diagram illustrating a structure example of a storage device.

A storage device 105 in FIG. 6 is a modification example of the storage device 104. The storage device 105 includes a memory cell array 115 including a memory cell 15. The memory cell 15 includes the memory cell 20 and a backup circuit 35. The backup circuit 35 is a modification example of the backup circuit 34. In the backup circuit 35, the transistor MP1 is provided instead of the transistor MN1.

In the circuit structure of FIG. 6, VPRE1>VPRE2 is satisfied. In the case where the nodes A1 and A2 are electrically connected to the node Qb, VPRE1<VPRE2 is satisfied.

The storage device 105 can operate in accordance with the timing chart in FIG. 5B. However, the voltage level of the wiring CL is inverted. The wiring CL is "H" in the normal operation and is "L" in the backup operation and the recovery operation. Note that the wiring CL is set to "L" in the power-off period.

Note that when the voltage of the node SN1 is VHSN, the voltage of the wiring CL is set such that the transistor MP1 is off. For example, the voltages "L" and "H" of the wiring CL can be Vssm and VHSN or Vddm and Vddm2. Note that Vddm2 is voltage higher than Vddm.

Although the backup circuit is used in the single-port SRAM memory cell in the structure example, any of the backup circuits in this embodiment can also be used in a multi-port SRAM memory cell. Such examples are described below.

<Storage Device 106>

Figure 7:
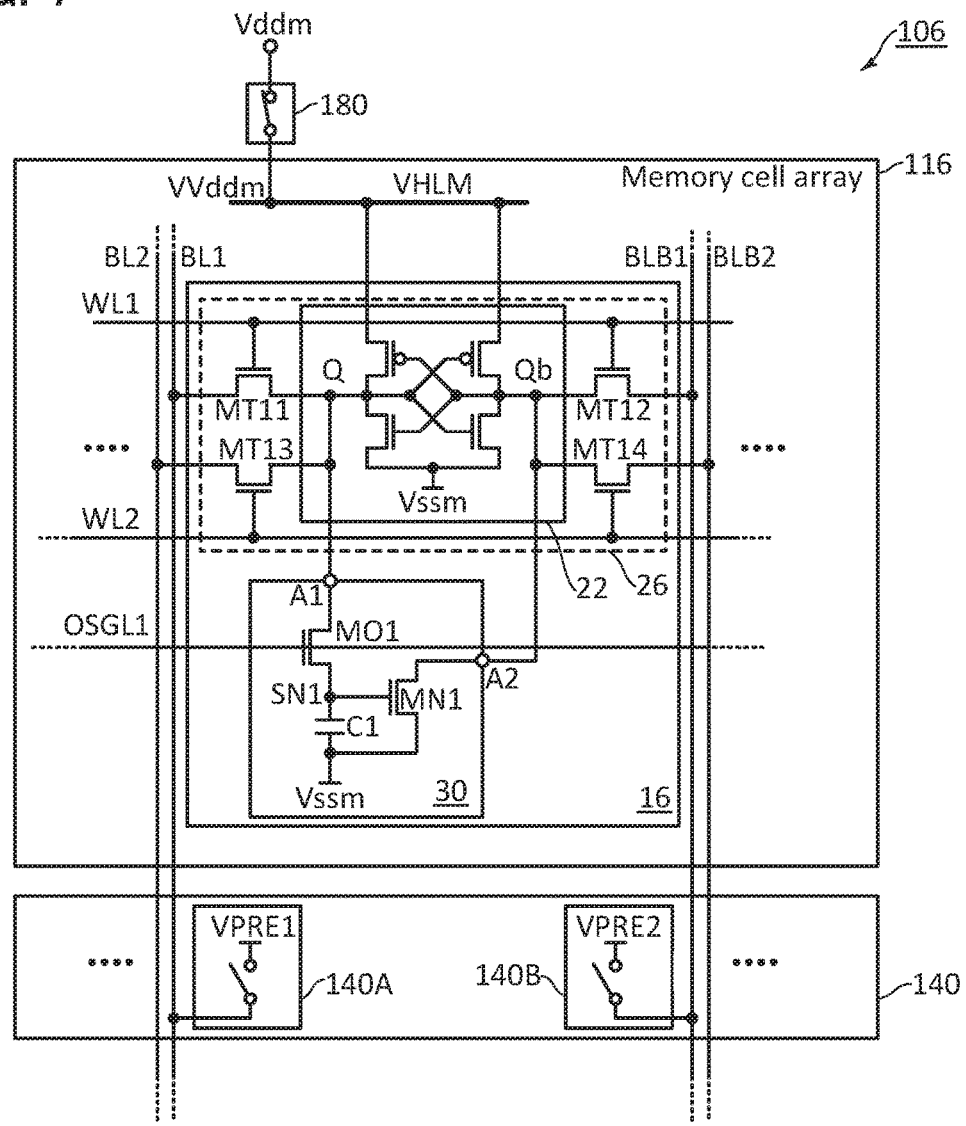
FIG. 7 is a circuit diagram illustrating a structure example of a storage device.

FIG. 7 illustrates a structure example of a storage device including a multi-port memory cell. A storage device 106 in FIG. 7 includes a memory cell array 116 including a memory cell 16. The memory cell array 116 includes the word line WL1, a word line WL2, a pair of bit lines BL1 and BLB1, a pair of bit lines BL2 and BLB2, and the wiring OSGL1.

The memory cell 16 includes a memory cell 26 and the backup circuit 30. The memory cell 26 is a multi-port SRAM memory cell, which includes the bistable circuit 22 and transistors MT11 to MT14. The transistors MT11 to MT14 function as transfer transistors.

The precharge circuit 140A is connected to the bit line BL1, and the precharge circuit 140B is connected to the bit line BLB1. The storage device 106 can operate in accordance with the timing chart in FIG. 1B. In the example of FIG. 7, the word line WL1 is set to "H" when the nodes Q and Qb are precharged with VPRE1 and VPRE2, respectively.

Note that the precharge circuit 140A can be connected to the bit line BL2, and the precharge circuit 140B can be connected to the bit line BLB2. The word line WL2 is set to "H" when the nodes Q and Qb are precharged with VPRE1 and VPRE2, respectively.

<Storage Device 107>

Figure 8:
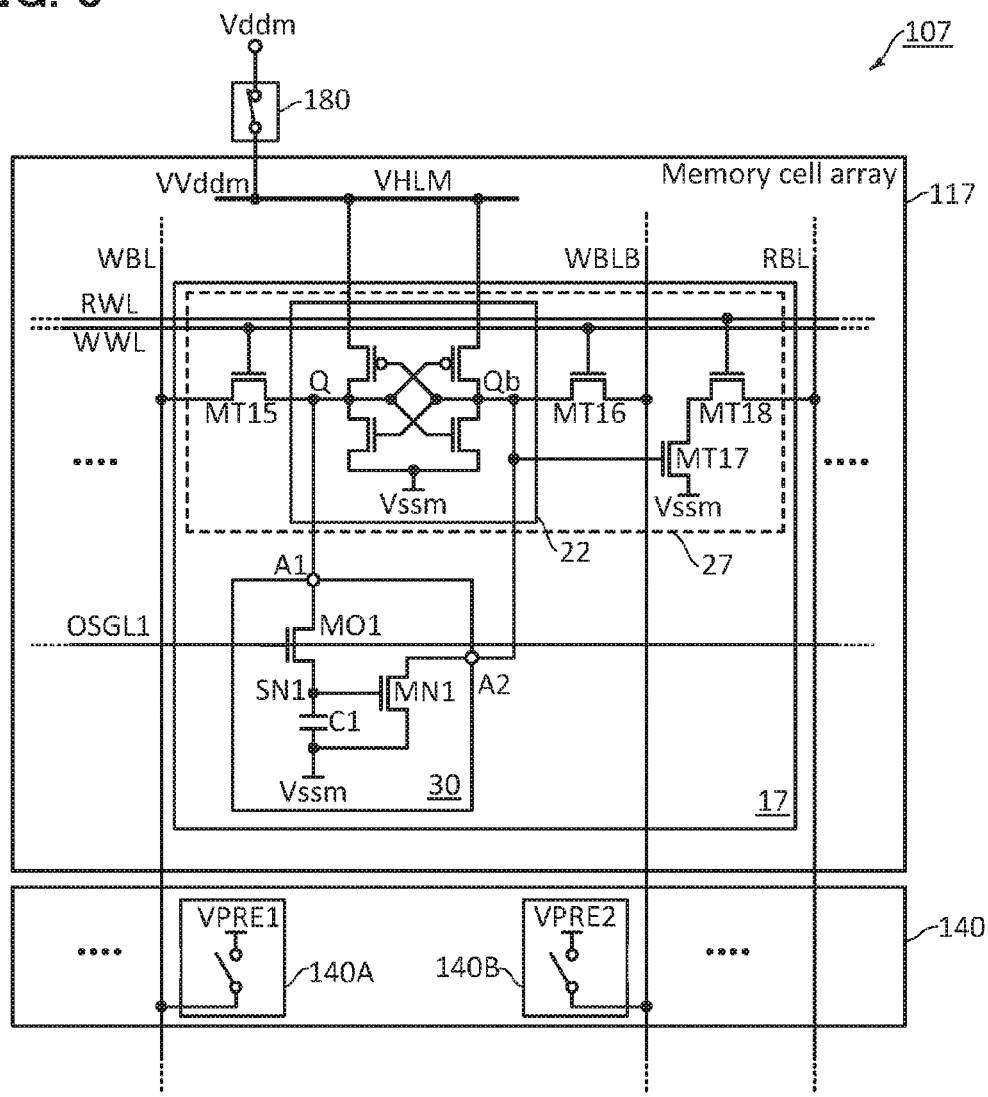
FIG. 8 is a circuit diagram illustrating a structure example of a storage device.

FIG. 8 illustrates a structure example of a storage device including a multi-port memory cell. A storage device 107 in FIG. 8 includes a memory cell array 117 including a memory cell 17. The memory cell array 117 includes a write word line WWL, a read word line RWL, write bit lines WBL and WBLB, a read bit line RBL, and the wiring OSGL1.

The memory cell 17 includes a memory cell 27 and the backup circuit 30. The memory cell 27 is a multi-port SRAM memory cell, which includes the bistable circuit 22 and transistors MT15 to MT18. The transistors MT15 and MT16 function as transfer transistors. The transistors MT17 and MT18 form a read circuit.

The precharge circuit 140A is connected to the write bit line WBL, and the precharge circuit 140B is connected to the write bit line WBLB. The storage device 107 can operate in accordance with the timing chart in FIG. 1B. In the example of FIG. 8, the write word line WWL is set to "H" when the nodes Q and Qb are precharged with VPRE1 and VPRE2, respectively.

Note that the backup circuit in the memory cell 17 of the storage device 107 is not limited to the backup circuit 30. The variety of backup circuits described above can be used. The same applies to the storage device 106.

<Backup Circuits 51 to 53>

An OS transistor with a back gate can be used as an n-channel transistor included in any of the backup circuits described above. The back gate of the OS transistor may be electrically connected to any of a gate, a source, or a drain of the OS transistor. Alternatively, the back gate of the OS transistor may be electrically connected to a wiring to which voltage is input from the outside.

Some structure examples of a backup circuit including an OS transistor with a back gate are described below.

Figure 9A:
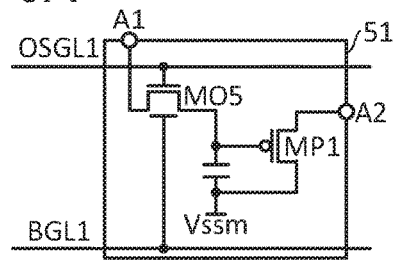
FIGS. 9A to 9C are circuit diagrams each illustrating a structure example of a backup circuit.

A backup circuit 51 in FIG. 9A is a modification example of the backup circuit 31 in FIG. 2. In the backup circuit 51, a transistor MO5 is provided instead of the transistor MO1. The transistor MO5 is an OS transistor with a back gate. Voltage is applied to the back gate of the transistor MO5 from the outside; thus, the back gate of the transistor MO5 is electrically connected to a wiring BGL1. By controlling the voltage of the back gate of the transistor MO5, appropriate threshold voltage for operation of the backup circuit 51 can be applied to the transistor MO5.

Figure 9B:
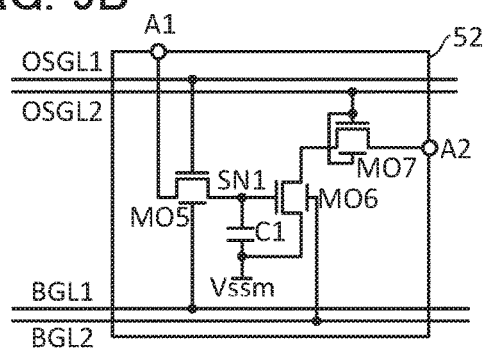

A backup circuit 52 in FIG. 9B is a modification example of the backup circuit 32 in FIG. 3A. In the backup circuit 52, the transistor MO5 and transistors MO6 and MO7 are provided instead of the transistors MO1, MN1, and MN2. Each of the transistors MO5 to MO7 is an OS transistor with a back gate. The back gates of the transistors MO5 and MO6 are electrically connected to the wiring BGL1 and a wiring BGL2, respectively. The back gate of the transistor MO7 is electrically connected to a gate of the transistor MO7.

By controlling the voltages of the back gates of the transistors MO5 and MO6, appropriate threshold voltages for operation of the backup circuit 52 can be applied to the transistors MO5 and MO6. In addition, when the wiring OSGL2 is set to "H," high-level voltage is input to the gate and back gate of the transistor MO7; thus, the current drive capability of the transistor MO7 in recovery operation can be improved.

Figure 9C:
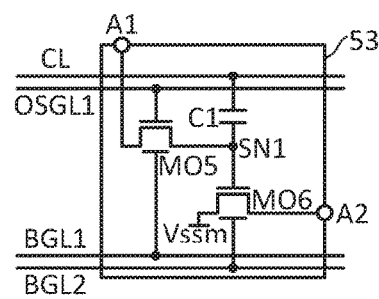

A backup circuit 53 in FIG. 9C is a modification example of the backup circuit 34 in FIG. 5A. In the backup circuit 53, the transistors MO5 and MO6 are provided instead of the transistors MO1 and MN1. The back gates of the transistors MO5 and MO6 are electrically connected to the wirings BGL1 and BGL2, respectively.

<Precharge Circuits 141 to 143>

Figure 10A:
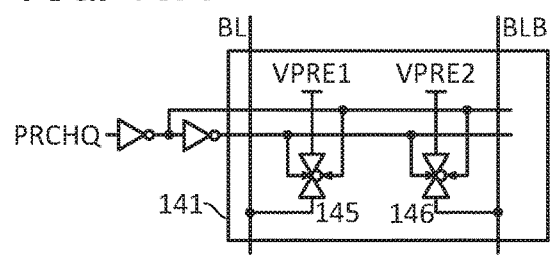
FIGS. 10A to 10C are circuit diagrams each illustrating a structure example of a precharge circuit.
Figure 10B:
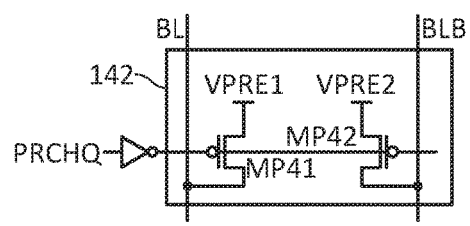
Figure 10C:
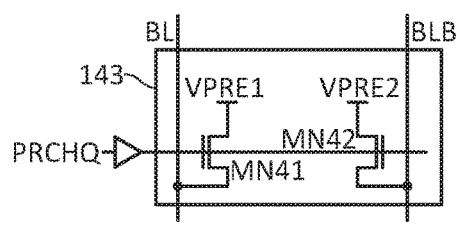

FIGS. 10A to 10C each illustrate a specific example of the circuit structure of the precharge circuit 140.

A precharge circuit 141 in FIG. 10A includes analog switches (also referred to as transfer gates, for example) 145 and 146. A precharge circuit 142 in FIG. 10B includes transistors MP41 and MP42. A precharge circuit 143 in FIG. 10C includes transistors MN41 and MN42.

When a signal PRCHQ is "H," the precharge circuit 141 is activated, and the bit lines BL and BLB are precharged with VPRE1 and VPRE2, respectively, by the analog switches 145 and 146. The precharge circuits 142 and 143 operate similarly.

Any of the storage devices in this embodiment includes a memory cell including a bistable circuit. In order that the memory cell is power-gated, the storage device includes a backup circuit of the bistable circuit and a precharge circuit having a function of applying different voltages to the bit lines BL and BLB. With the precharge circuit having such a function, the backup circuit may have a function of storing one of two pieces of complementary data retained in the bistable circuit. Thus, the number of elements and wirings in the backup circuit can be reduced. Consequently, the area overhead of the memory cell due to addition of the backup circuit can be reduced.

This can be understood by comparison between a storage circuit 180 disclosed in Patent Document 1 (see FIG. 5 in Patent Document 1) and the backup circuit 32 in FIG. 3A. The storage circuit 180 disclosed in Patent Document 1 includes six transistors and two capacitors. In contrast, the backup circuit 32 includes three transistors and one capacitor.

Any of the storage devices with a backup function in this embodiment can be used as a storage device in any of a variety of electronic components or electronic devices. The storage device can be power-gated when it is not accessed; thus, the power consumption of an electronic component and an electronic device each including the storage device can be reduced.

Any of the storage devices in this embodiment typically substitutes for an SRAM. For example, any of the storage devices in this embodiment can be implemented in any of a variety of processors such as a microcontroller unit (MCU), an FPGA, a CPU, and a GPU as a substitute for an SRAM. In addition, any of the storage devices in this embodiment can be implemented in any of a variety of ICs such as a wireless IC, a display controller IC, a source driver IC, and an image decoder IC. An MCU is described below as an example of a processor.

<MCU 300>

Figure 11:
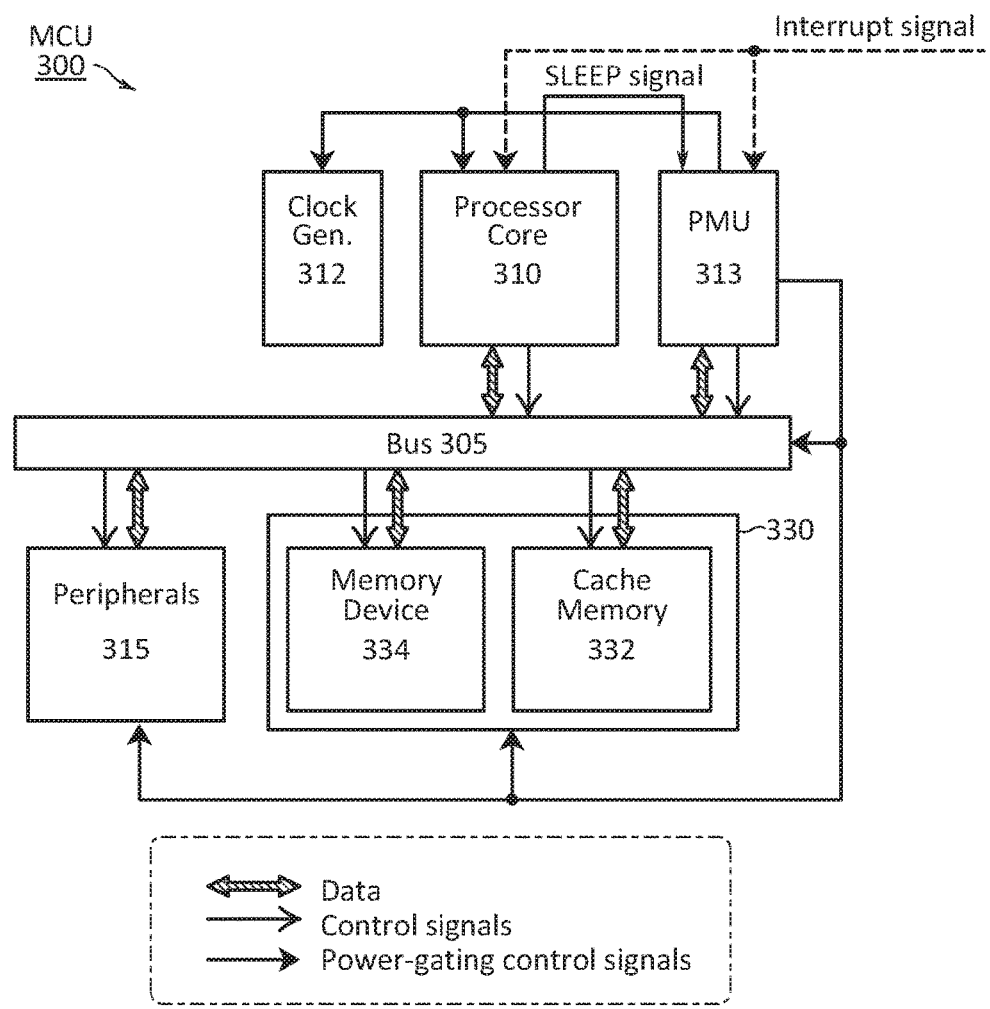
FIG. 11 is a block diagram illustrating a structure example of a microcontroller unit.

FIG. 11 illustrates a structure example of a microcontroller unit (MCU). An MCU 300 in FIG. 11 includes a bus 305, a processor core 310 (hereinafter referred to as a core 310), a clock generation circuit 312, a power management unit (PMU) 313, a peripheral circuit (Peripherals) 315, and a memory portion 330. The MCU 300 is a semiconductor device that is integrated into one chip.

The core 310 exchanges data with the PMU 313, the peripheral circuit 315, and the memory portion 330 through the bus 305. A control signal from the core 310 is input to the bus 305. The bus 305 transmits the control signal to a circuit block to be controlled. Examples of the control signal include an enable signal and an address signal.

The clock generation circuit 312 generates a clock signal that is used in the MCU 300.

There is no particular limitation on the function of the peripheral circuit 315. In the peripheral circuit 315, a variety of functional circuits are provided depending on the use of the MCU 300. Examples of the functional circuits include a power supply circuit, a timer device, an interrupt controller, an input/output port, an analog-digital converter, a comparator, and an operational amplifier.

The memory portion 330 includes a cache memory 332 and a storage device 334. The cache memory 332 is formed using any of the storage devices in this embodiment.

The memory portion 330 may include a plurality of hierarchical cache memories 332. For example, the memory portion 330 includes an L1 (level 1) cache memory, an L2 cache memory, and an L3 cache memory. In that case, any of the multi-port storage devices in this embodiment is used as the L1 cache memory, and the single-port storage device in this embodiment is used as each of the L2 and L3 cache memories. In addition, the multi-port storage device in this embodiment may be used as a register file in the core 310.

The storage device 334 can be any storage device as long as it is a rewritable memory. Examples of such a memory include a flash memory, a ferroelectric RAM (FeRAM), a magnetoresistive RAM (MRAM), a resistive RAM (ReRAM), and a phase-change RAM (PRAM).

The memory portion 330 does not necessarily include the storage device 334. Alternatively, the memory portion 330 may include a plurality of storage devices 334. The storage devices 334 included in the memory portion 330 may be a DRAM and a flash memory, for example. In addition, the memory portion 330 may include a read-only memory (ROM).

The PMU 313 has a function of controlling power gating. The PMU 313 generates a power gating control signal on the basis of a sleep (SLEEP) signal transmitted from the core 310, an interrupt signal input from the outside, and the like. The generated power gating control signal is transmitted to circuits in the MCU 300, for example, the bus 305 and the core 310. Each circuit executes power gating sequence in response to the power gating control signal. The cache memory 332 executes the power gating sequence.

<Example of Method for Manufacturing Electronic Component>

Figure 12A:
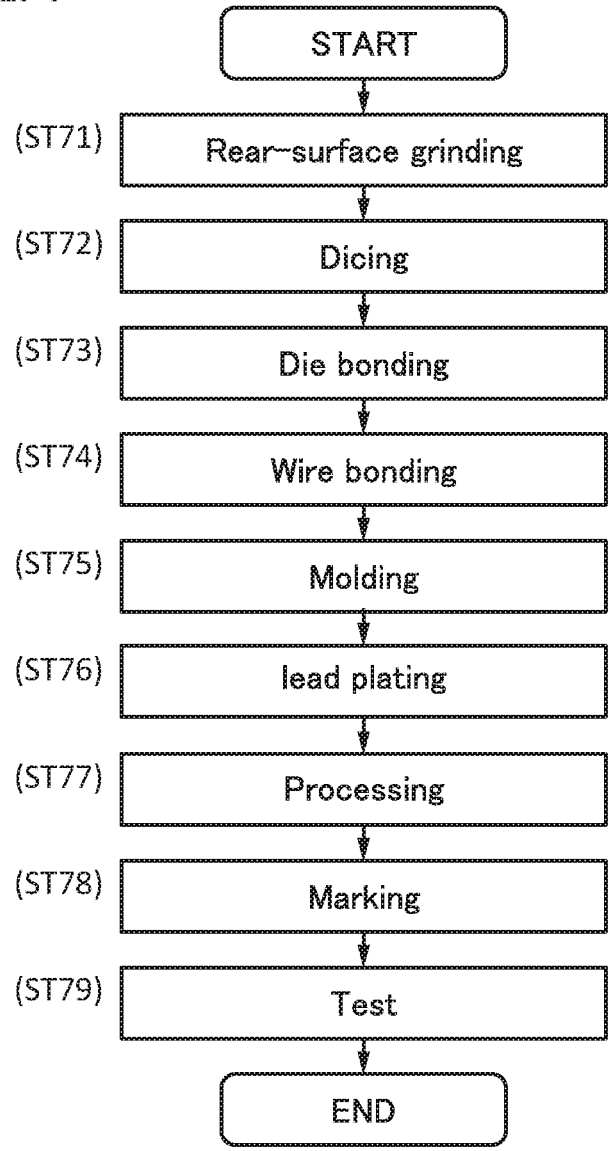
FIG. 12A is a flow chart showing an example of a method for manufacturing an electronic component and FIG. 12B is a schematic view illustrating a structure example of an electronic component.

FIG. 12A is a flow chart showing an example of a method for manufacturing an electronic component. The electronic component is also referred to as a semiconductor package or an IC package.

A semiconductor device including a transistor is completed by integrating detachable components on a printed circuit board through an assembly process (post-process). The post-process can be finished through steps in FIG. 12A. In a pre-process, first, a semiconductor device in one embodiment of the present invention and the like are provided on a semiconductor wafer (e.g., a silicon wafer).

In the post-process, first, a rear-surface grinding step in which a rear surface of the semiconductor wafer (a surface on which a semiconductor device and the like are not formed) is ground is performed (Step ST71). This step aims to reduce the size of the electronic component by thinning the semiconductor wafer through grinding. After Step ST71, a dicing step of separating the semiconductor wafer into a plurality of chips is performed (Step ST72). In the dicing step, the semiconductor wafer is cut along dicing lines, so that chips are cut out from the semiconductor wafer.

A die bonding step in which the separated chips are separately picked out and bonded on a lead frame is performed (Step ST73). In the die bonding step, the chip may be bonded to the lead frame by an appropriate method depending on a product, for example, with resin or tape. The chip may be bonded to an interposer substrate instead of the lead frame.

Next, a wire bonding step of electrically connecting a lead of the lead frame and an electrode on the chip with a metal fine line (wire) is performed (Step ST74). A silver line, a gold line, or the like can be used as the metal fine line. For wire bonding, ball bonding or wedge bonding can be employed, for example. A wire-bonded chip 7110 is subjected to a molding step of sealing the chip with epoxy resin or the like (Step ST75).

The lead of the lead frame is plated in a lead plating step (Step ST76). Then, the lead is cut and processed into a predetermined shape in a formation step (Step ST77). A printing (marking) step is performed on a surface of the package (Step ST78). After an inspection step (Step ST79) for checking whether an external shape is acceptable and whether there is a malfunction, for example, the electronic component is completed.

Figure 12B:
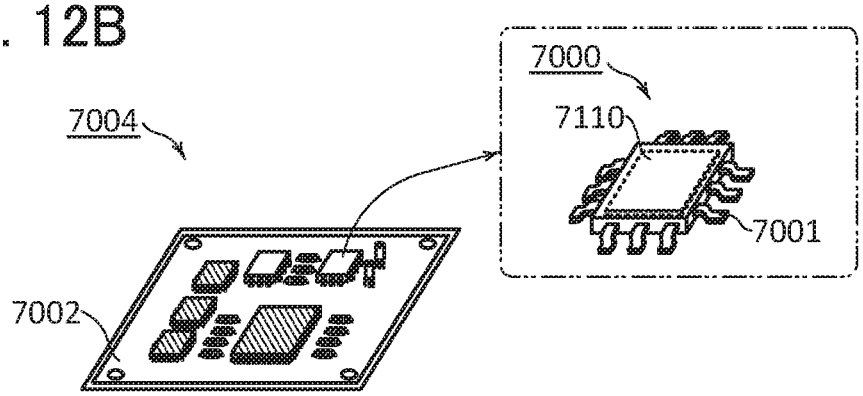

FIG. 12B is a schematic perspective view of the completed electronic component. The electronic component has a plurality of standards and names depending on a terminal extraction direction and a terminal shape. FIG. 12B illustrates a quad flat package (QFP) as an example of the electronic component.

An electronic component 7000 in FIG. 12B includes a lead 7001 and the chip 7110. The chip 7110 includes any of the storage devices in this embodiment or a processor including the storage device.

The electronic component 7000 may include a plurality of chips 7110. The electronic component 7000 is mounted on a printed circuit board 7002, for example. A plurality of electronic components 7000 are combined and electrically connected to each other over the printed circuit board 7002; thus, a circuit board on which the electronic components are mounted (a circuit board 7004) is completed. The circuit board 7004 is provided in an electronic device or the like.

The electronic component 7000 includes a low-power semiconductor device; thus, implementation of the electronic component 7000 in an electronic device can reduce the power consumption of the electronic device. Next, electronic devices each including the electronic component are described.

Figure 13A:
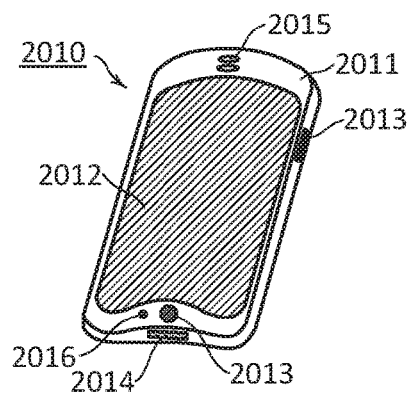
FIGS. 13A to 13F each illustrate a structure example of an electronic device.

An information terminal 2010 in FIG. 13A includes a display portion 2012 incorporated into a housing 2011, an operation button 2013, an external connection port 2014, a speaker 2015, and a microphone 2016. Here, a display region of the display portion 2012 is curved. The information terminal 2010 is a portable information terminal driven with a battery and can be used as a tablet information terminal or a smartphone. The information terminal 2010 has functions such as phone calls, e-mailing, an appointment organizer, Internet communication, and music reproduction. Information can be input by touching the display portion 2012 with a finger or the like. Various operations such as making a phone call, inputting characters, and screen switching of the display portion 2012 can be performed by touching the display portion 2012 with a finger or the like. The information terminal 2010 can be operated by inputting sound from the microphone 2016. Various operations such as power on/off operation and screen switching of the display portion 2012 can be performed by pressing the operation button 2013.

Figure 13B:
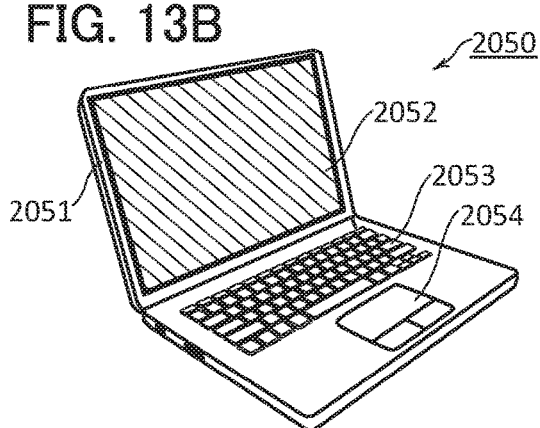

A laptop 2050 in FIG. 13B includes a housing 2051, a display portion 2052, a keyboard 2053, and a pointing device 2054. The laptop 2050 can be operated by touch operation of the display portion 2052.

Figure 13C:
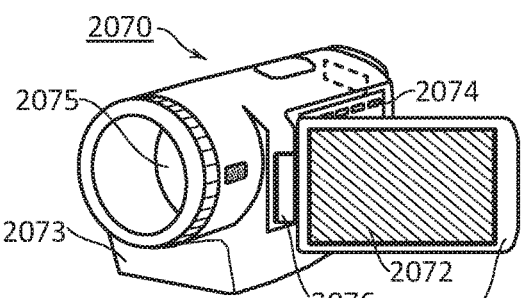

A video camera 2070 in FIG. 13C includes a housing 2071, a display portion 2072, a housing 2073, an operation key 2074, a lens 2075, and a joint 2076. The display portion 2072 is provided in the housing 2071. The operation key 2074 and the lens 2075 are provided in the housing 2073.

The housing 2071 and the housing 2073 are connected to each other with the joint 2076, and the angle between the housing 2071 and the housing 2073 can be changed with the joint 2076. Images on the display portion 2072 may be switched in accordance with the angle between the housing 2071 and the housing 2073 at the joint 2076. Various operations such as starting or stopping video recording, magnification and zoom adjustment, and changing a shooting range can be performed by touch operation of the display portion 2072.

Figure 13D:
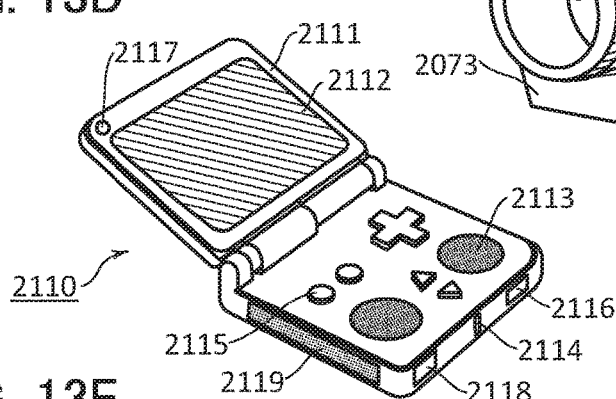

A portable game machine 2110 in FIG. 13D includes a housing 2111, a display portion 2112, speakers 2113, an LED lamp 2114, operation key buttons 2115, a connection terminal 2116, a camera 2117, a microphone 2118, and a recording medium read portion 2119.

Figure 13E:
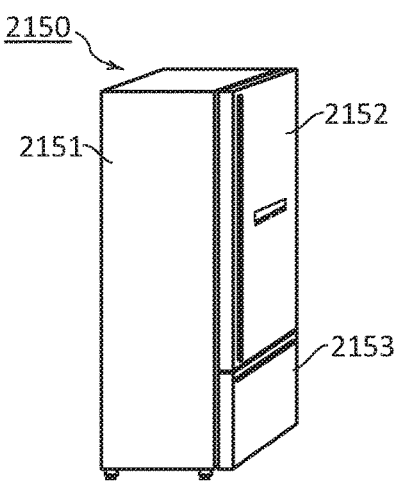

An electric refrigerator-freezer 2150 in FIG. 13E includes a housing 2151, a refrigerator door 2152, a freezer door 2153, and the like.

Figure 13F:
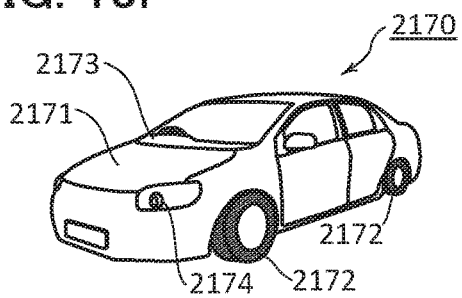

A motor vehicle 2170 in FIG. 13F includes a car body 2171, wheels 2172, a dashboard 2173, lights 2174, and the like.

Embodiment 2

The storage device in Embodiment 1 includes the OS transistors; thus, the storage device has a stacked structure in which the OS transistors are stacked over Si transistors. The stacked structure of the storage device in Embodiment 1 is described with reference to FIG. 14.

<Stacked Structure of Storage Device>

Figure 14:
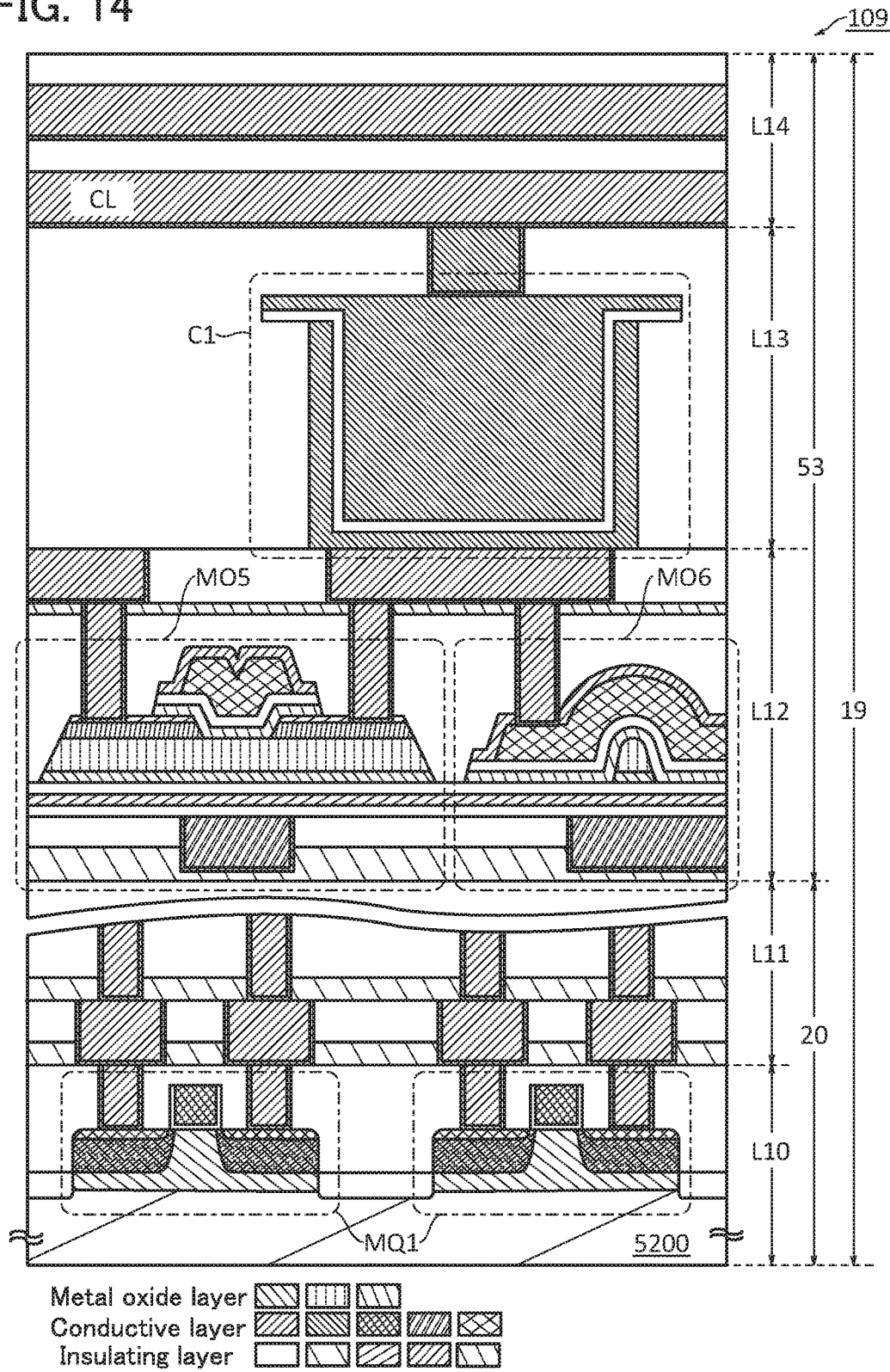
FIG. 14 is a cross-sectional view illustrating an example of a stacked structure of a storage device.

A storage device 109 in FIG. 14 includes a memory cell 19 in a memory cell array. The memory cell 19 includes the memory cell 20 and the backup circuit 53 in FIG. 9C. FIG. 14 is not a cross-sectional view of the storage device 109 taken along a specific line but a cross-sectional view for illustrating an example of the stacked structure of the storage device 109.

The storage device 109 includes stacked layers L10 to L14. The memory cell 19, a peripheral circuit for driving the memory cell array, and the like are provided in the stacked layers L10 and L11. Si transistors MQ1 included in the storage device 109 are provided in the layer L10. The layer L10 includes wirings, plugs, and the like. Active layers of the Si transistors are formed using a single crystalline silicon wafer 5200.

OS transistors, wirings (e.g., a word line), plugs, and the like are provided in the layer L12. The structures of the transistors MO5 and MO6 in FIG. 14 are similar to the structure of an OS transistor 5001 (see FIG. 15A) to be described later. The layer L13 is a capacitor layer in which the capacitor C1 is provided. A plug for electrically connecting the capacitor C1 and the transistors MO5 and MO6, and the like are also provided in the layer L13. Wirings (e.g., the wiring CL and the power supply line for Vssm), plugs, and the like are provided in the layer L14.

Next, structure examples of OS transistors are described with reference to FIGS. 15A and 15B.

<Structure Example 1 of OS Transistor>

Figure 15A:
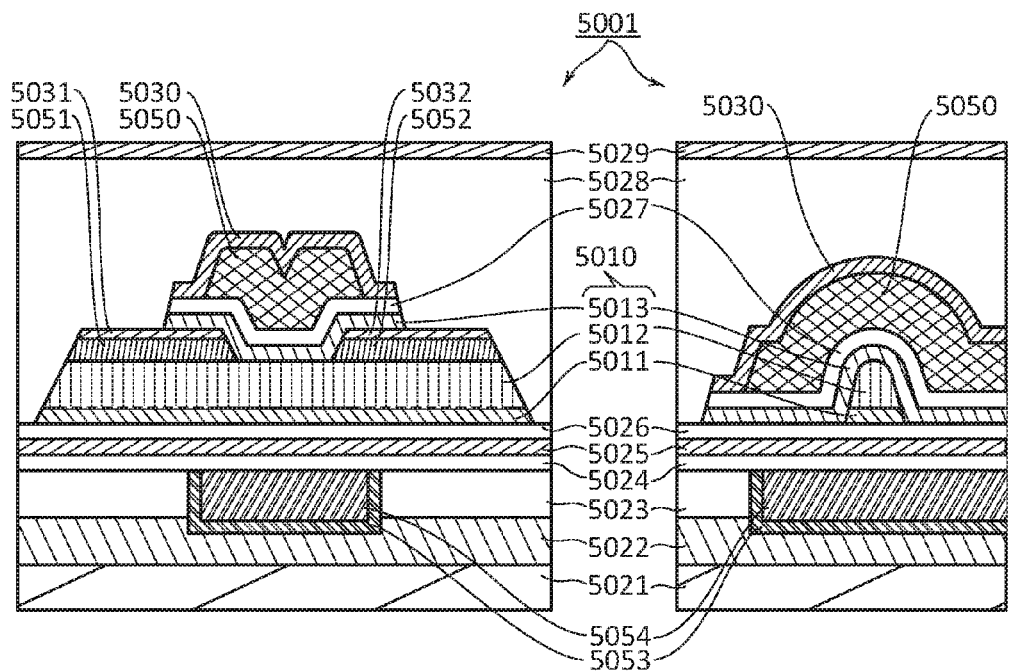
FIGS. 15A and 15B are cross-sectional views each illustrating a structure example of an OS transistor.

FIG. 15A illustrates a structure example of an OS transistor. The OS transistor 5001 in FIG. 15A is a metal oxide transistor. A cross-sectional view of the OS transistor 5001 in a channel length direction is illustrated on the left drawing of FIG. 15A, and a cross-sectional view of the OS transistor 5001 in a channel width direction is illustrated on the right drawing of FIG. 15A.

The OS transistor 5001 is formed over an insulating surface, here, over an insulating layer 5021. The OS transistor 5001 is covered with insulating layers 5028 and 5029. The OS transistor 5001 includes insulating layers 5022 to 5027 and 5030 to 5032, metal oxide layers 5011 to 5013, and conductive layers 5050 to 5054.

Note that an insulating layer, a metal oxide layer, a conductor, and the like in a drawing may have a single-layer structure or a stacked structure. These elements can be formed by any of a variety of deposition methods such as sputtering, molecular beam epitaxy (MBE), pulsed laser deposition (PLD), CVD, and atomic layer deposition (ALD). Examples of CVD include plasma-enhanced CVD, thermal CVD, and metal organic CVD.

The metal oxide layers 5011 to 5013 are collectively referred to as an oxide layer 5010. As illustrated in FIG. 15A, the oxide layer 5010 includes a portion where the metal oxide layer 5011, the metal oxide layer 5012, and the metal oxide layer 5013 are stacked in that order. When the OS transistor 5001 is on, a channel is mainly formed in the metal oxide layer 5012 of the oxide layer 5010.

A gate electrode of the OS transistor 5001 is formed using the conductive layer 5050. A pair of electrodes that functions as a source electrode and a drain electrode of the OS transistor 5001 is formed using the conductive layers 5051 and 5052. The conductive layers 5050 to 5052 are covered with the insulating layers 5030 to 5032 that function as barrier layers. A back gate electrode of the OS transistor 5001 is formed using a stack of the conductive layers 5053 and 5054. The OS transistor 5001 does not necessarily include a back gate electrode. The same applies to an OS transistor 5002 to be described later.

A gate insulating layer on a gate (front gate) side is formed using the insulating layer 5027. A gate insulating layer on a back gate side is formed using a stack of the insulating layers 5024 to 5026. The insulating layer 5028 is an interlayer insulating layer. The insulating layer 5029 is a barrier layer.

The metal oxide layer 5013 covers a stack of the metal oxide layers 5011 and 5012 and the conductive layers 5051 and 5052. The insulating layer 5027 covers the metal oxide layer 5013. The conductive layers 5051 and 5052 each include a region that overlaps with the conductive layer 5050 with the metal oxide layer 5013 and the insulating layer 5027 positioned therebetween.

Examples of a conductive material used for the conductive layers 5050 to 5054 include a semiconductor typified by polycrystalline silicon doped with an impurity element such as phosphorus; silicide such as nickel silicide; a metal such as molybdenum, titanium, tantalum, tungsten, aluminum, copper, chromium, neodymium, or scandium; and a metal nitride containing the above metal as its component (tantalum nitride, titanium nitride, molybdenum nitride, or tungsten nitride). A conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used.

For example, the conductive layer 5050 is a single layer of tantalum nitride or tungsten. Alternatively, in the case where the conductive layer 5050 has a two-layer structure or a three-layer structure, the following combinations can be used: aluminum and titanium; titanium nitride and titanium; titanium nitride and tungsten; tantalum nitride and tungsten; tungsten nitride and tungsten; titanium, aluminum, and titanium; titanium nitride, aluminum, and titanium; and titanium nitride, aluminum, and titanium nitride. The conductor described first is used for a layer on the insulating layer 5027 side.

The conductive layers 5051 and 5052 have the same layer structure. For example, in the case where the conductive layer 5051 is a single layer, any of metals such as aluminum, titanium, chromium, nickel, copper, yttrium, zirconium, molybdenum, silver, tantalum, and tungsten, or an alloy containing any of these metals as its main component may be used. Alternatively, in the case where the conductive layer 5051 has a two-layer structure or a three-layer structure, the following combinations can be used: titanium and aluminum; tungsten and aluminum; tungsten and copper; a copper-magnesium-aluminum alloy and copper; a titanium film and copper; titanium or titanium nitride, aluminum or copper, and titanium or titanium nitride; and molybdenum or molybdenum nitride, aluminum or copper, and molybdenum or molybdenum nitride. The conductor described first is used for a layer on the insulating layer 5027 side.

For example, it is preferable that the conductive layer 5053 be a conductive layer that has a hydrogen barrier property (e.g., a tantalum nitride layer) and that the conductive layer 5054 be a conductive layer that has higher conductivity than the conductive layer 5053 (e.g., tungsten). With such a structure, a stack of the conductive layer 5053 and the conductive layer 5054 functions as a wiring and has a function of suppressing diffusion of hydrogen into the oxide layer 5010.

Examples of insulating materials used for the insulating layers 5021 to 5032 include aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. The insulating layers 5021 to 5030 are formed using a single-layer structure or a stacked structure of these insulating materials. The layers used for the insulating layers 5021 to 5030 may include a plurality of insulating materials.

Note that in this specification and the like, an oxynitride refers to a substance that contains more oxygen than nitrogen, and a nitride oxide refers to a substance that contains more nitrogen than oxygen.

In the OS transistor 5001, the oxide layer 5010 is preferably surrounded by an insulating layer with oxygen and hydrogen barrier properties (hereinafter such an insulating layer is referred to as a barrier layer). With such a structure, it is possible to suppress the release of oxygen from the oxide layer 5010 and entry of hydrogen into the oxide layer 5010; thus, the reliability and electrical characteristics of the OS transistor 5001 can be improved.

For example, the insulating layer 5029 functions as a barrier layer and at least one of the insulating layers 5021, 5022, and 5024 functions as a barrier layer. The barrier layer can be formed using a material such as aluminum oxide, aluminum oxynitride, gallium oxide, gallium oxynitride, yttrium oxide, yttrium oxynitride, hafnium oxide, hafnium oxynitride, or silicon nitride. A barrier layer may be provided between the oxide layer 5010 and the conductive layer 5050. Alternatively, a metal oxide layer that has oxygen and hydrogen barrier properties may be provided as the metal oxide layer 5013.

The insulating layer 5030 is preferably a barrier layer that prevents oxidation of the conductive layer 5050. When the insulating layer 5030 has an oxygen barrier property, oxidation of the conductive layer 5050 due to oxygen released from the insulating layer 5028 or the like can be suppressed.

For example, the insulating layer 5030 can be formed using a metal oxide such as aluminum oxide.

A structure example of the insulating layers 5021 to 5032 is described. In this example, each of the insulating layers 5021, 5022, 5025, 5029, and 5030 to 5032 functions as a barrier layer. The insulating layers 5026 to 5028 are oxide layers containing excess oxygen. The insulating layer 5021 is formed using silicon nitride. The insulating layer 5022 is formed using aluminum oxide. The insulating layer 5023 is formed using silicon oxynitride. The gate insulating layers (5024 to 5026) on the back gate side are formed using a stack of silicon oxide, aluminum oxide, and silicon oxide. The gate insulating layer (5027) on the front gate side is formed using silicon oxynitride. The interlayer insulating layer (5028) is formed using silicon oxide. The insulating layers 5029 and 5030 to 5032 are formed using aluminum oxide.

FIG. 15A illustrates an example in which the oxide layer 5010 has a three-layer structure; however, one embodiment of the present invention is not limited thereto. For example, the oxide layer 5010 can have a two-layer structure without the metal oxide layer 5011 or 5013 or may be composed of one of the metal oxide layers 5011 and 5012. Alternatively, the oxide layer 5010 may be composed of four or more metal oxide layers.

<Structure Example 2 of OS Transistor>

Figure 15B:
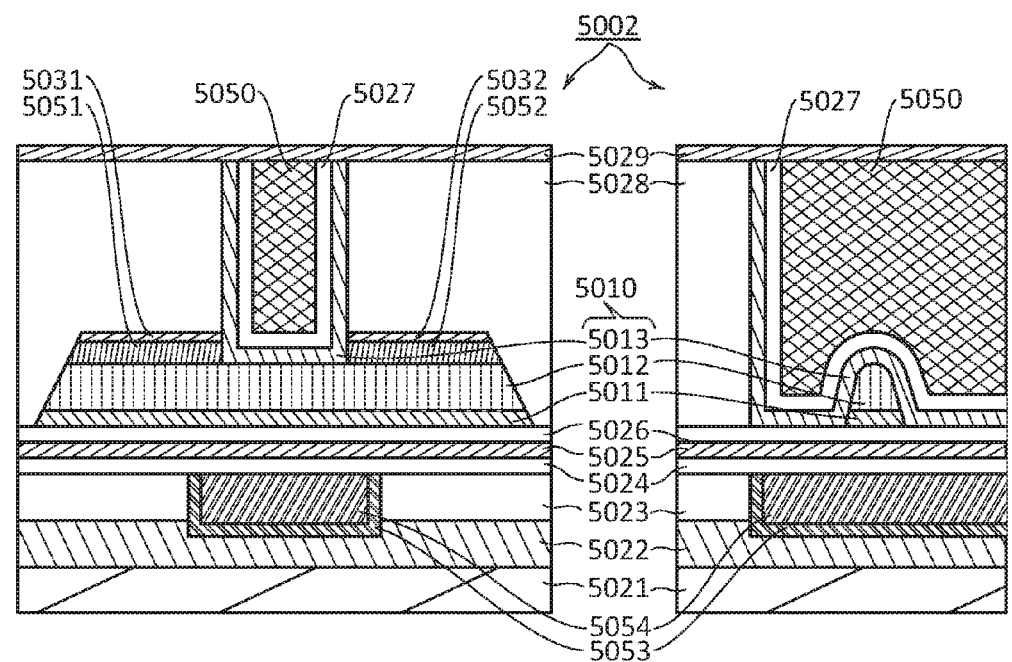

FIG. 15B illustrates a structure example of an OS transistor. The OS transistor 5002 in FIG. 15B is a modification example of the OS transistor 5001. The OS transistor 5002 differs from the OS transistor 5001 mainly in the structure of the gate electrode. A cross-sectional view of the OS transistor 5002 in a channel length direction is illustrated on the left drawing of FIG. 15B, and a cross-sectional view of the OS transistor 5002 in a channel width direction is illustrated on the right drawing of FIG. 15B.

The metal oxide layer 5013, the insulating layer 5027, and the conductive layer 5050 are provided in an opening portion formed in the insulating layer 5028. In other words, a gate electrode is formed in a self-aligning manner by using the opening portion of the insulating layer 5028. Thus, in the OS transistor 5002, a gate electrode (5050) does not include a region that overlaps with a source electrode or a drain electrode (5051 or 5052) with a gate insulating layer (5017) positioned therebetween. Accordingly, gate-source parasitic capacitance and gate-drain parasitic capacitance can be reduced and frequency characteristics can be improved. Furthermore, gate electrode width can be controlled by the opening portion of the insulating layer 5028; thus, it is easy to manufacture an OS transistor with short channel length.

A channel formation region of the OS transistor preferably includes a cloud-aligned composite oxide semiconductor (CAC-OS).

The CAC-OS has a conducting function in part of a material and has an insulating function in another part of the material; as a whole, the CAC-OS functions as a semiconductor. Note that in the case where the CAC-OS is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS can have a switching function (on/off function). In the CAC-OS, separation of the functions can maximize each function.

The CAC-OS includes conductive regions and insulating regions. The conductive regions have the conducting function, and the insulating regions have the insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred in some cases.

Furthermore, in the CAC-OS, the conductive regions and the insulating regions each have a size of greater than or equal to 0.5 nm and less than or equal to 10 nm, preferably greater than or equal to 0.5 nm and less than or equal to 3 nm and are dispersed in the material in some cases.

The CAC-OS includes components having different bandgaps. For example, the CAC-OS includes a component having a wide gap due to an insulating region and a component having a narrow gap due to a conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the CAC-OS is used in a channel formation region of a transistor, high current drive capability and high field-effect mobility of the OS transistor can be obtained.

A metal oxide semiconductor is classified into a single crystal metal oxide semiconductor and a non-single-crystal metal oxide semiconductor according to crystallinity. Examples of a non-single-crystal metal oxide semiconductor include a c-axis aligned crystalline oxide semiconductor (CAAC-OS), a polycrystalline oxide semiconductor, a nanocrystalline oxide semiconductor (nc-OS), and an amorphous-like oxide semiconductor (a-like OS).

The channel formation region of the OS transistor preferably includes a metal oxide including a crystal part, such as a CAAC-OS or an nc-OS.

The CAAC-OS has c-axis alignment, its nanocrystals are connected in the a-b plane direction, and its crystal structure has distortion. Note that distortion refers to a portion where the direction of lattice arrangement changes between a region with uniform lattice arrangement and another region with uniform lattice arrangement in a region where the nanocrystals are connected.

The shape of the nanocrystal is basically a hexagon. However, the shape is not always a regular hexagon and is a non-regular hexagon in some cases. Pentagonal lattice arrangement, heptagonal lattice arrangement, and the like are included in the distortion in some cases. Note that a clear crystal grain boundary cannot be observed even in the vicinity of distortion in the CAAC-OS. That is, formation of a grain boundary is inhibited due to the distortion of lattice arrangement. This is probably because the CAAC-OS can tolerate distortion owing to the low density of arrangement of oxygen atoms in the a-b plane direction, a change in interatomic bond distance by substitution of a metal element, and the like.

The CAAC-OS tends to have a layered crystal structure (also referred to as a layered structure) in which a layer containing indium and oxygen (hereinafter referred to as an In layer) and a layer containing an element M, zinc, and oxygen (hereinafter referred to as an (M,Zn) layer) are stacked. Note that indium and the element M can be replaced with each other, and when the element M of the (M,Zn) layer is replaced with indium, the layer can also be referred to as an (In,M,Zn) layer. When indium of the In layer is replaced with the element M, the layer can also be referred to as an (In,M) layer.

In the nc-OS, a microscopic region (for example, a region with a size greater than or equal to 1 nm and less than or equal to 10 nm, in particular, a region with a size greater than or equal to 1 nm and less than or equal to 3 nm) has periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide semiconductor depending on an analysis method.

The a-like OS has a structure between those of the nc-OS and the amorphous oxide semiconductor. The a-like OS has a void or a low-density region. The a-like OS has lower crystallinity than the nc-OS and the CAAC-OS.

In this specification and the like, a CAC refers to the function or material of a metal oxide semiconductor, and a CAAC refers to the crystal structure of a metal oxide semiconductor.

This application is based on Japanese Patent Application Serial No. 2016-176930 filed with Japan Patent Office on Sep. 9, 2016, the entire contents of which are hereby incorporated by reference.

What is claimed is:

1. A storage device comprising:
a memory cell comprising:
   a bistable circuit comprising a first node and a second node;
   a first transistor between the first node and a first bit line;
   a second transistor between the second node and a second bit line; and
   a backup circuit,
a precharge circuit configured to input first voltage to the first bit line and input second voltage to the second bit line,
wherein the backup circuit comprises:
   a third transistor comprising an oxide semiconductor in a channel formation region;
   a fourth transistor;
   a capacitor;
   an input node electrically connected to a first terminal of the third transistor;
   a retention node electrically and directly connected to a second terminal of the third transistor, a gate of the fourth transistor, and a first terminal of the capacitor; and
   an output node electrically connected to a first terminal of the fourth transistor,
wherein the input node is electrically connected to the first node, and
wherein the output node is electrically connected to one of the first node and the second node.

2. The storage device according to claim 1,
wherein a second terminal of the fourth transistor is electrically connected to a first wiring, and
wherein a second terminal of the capacitor is electrically connected to the first wiring.

3. The storage device according to claim 1,
wherein a second terminal of the fourth transistor is electrically connected to a first wiring, and
wherein a second terminal of the capacitor is electrically connected to a fourth wiring.

4. The storage device according to claim 1,
wherein a gate of the first transistor and a gate of the second transistor are electrically connected to a word line, and
wherein a gate of the third transistor is electrically connected to a second wiring.

5. The storage device according to claim 1,
wherein the backup circuit further comprises a fifth transistor between the first terminal of the fourth transistor and the output node, and
wherein a gate of the fifth transistor is electrically connected to a third wiring.

6. The storage device according to claim 1, wherein the backup circuit is configured to back up data of one of the first node and the second node.

7. The storage device according to claim 1, wherein magnitude of the first voltage is different from magnitude of the second voltage.

8. A semiconductor device comprising:
a processor core;
a memory portion comprising the storage device according to claim 1; and
a bus between the processor core and the memory portion.

9. The semiconductor device according to claim 8, wherein the memory portion further comprises at least one of a flash memory, a ferroelectric random access memory, a magnetoresistive random access memory, a resistive random access memory, and a phase-change random access memory.

10. An electronic component comprising:
a chip comprising the storage device according to claim 1; and
a lead electrically connected to the chip.

11. An electronic device comprising:
the electronic component according to claim 10; and
at least one of a display portion, a touch sensor, a microphone, a speaker, an operation key, and a housing.

12. A method for operating a storage device, the storage device comprising:
a memory cell comprising:
a bistable circuit comprising a first node and a second node;
a first transistor between the first node and a first bit line;
a second transistor between the second node and a second bit line; and
a backup circuit,
a precharge circuit configured to input first voltage to the first bit line and input second voltage to the second bit line,
wherein the backup circuit comprises:
a third transistor comprising an oxide semiconductor in a channel formation region;
a fourth transistor;
a capacitor;
an input node electrically connected to a first terminal of the third transistor;
a retention node electrically connected to a second terminal of the third transistor, a gate of the fourth transistor, and a first terminal of the capacitor; and
an output node electrically connected to a first terminal of the fourth transistor,
wherein the input node is electrically connected to the first node, and
wherein the output node is electrically connected to one of the first node and the second node,
the method comprising the steps of:
performing precharge operation where the first voltage is input to the first bit line and the second voltage is input to the second bit line by the precharge circuit while supply of power supply voltage to the bistable circuit is stopped,
turning on the first transistor and the second transistor during the precharge operation, and
starting the supply of the power supply voltage to the bistable circuit after the first transistor and the second transistor are turned off.

13. The storage device according to claim 1,
wherein the third transistor is an n-channel transistor, and
wherein the fourth transistor is a p-channel transistor.

* * * * *